(12) United States Patent
Kato et al.

(10) Patent No.: US 11,702,565 B2
(45) Date of Patent: Jul. 18, 2023

(54) POLYIMIDE VARNISH AND METHOD FOR PRODUCING SAME

(71) Applicant: ASAHI KASEI KABUSHIKI KAISHA, Tokyo (JP)

(72) Inventors: Satoshi Kato, Tokyo (JP); Toshiaki Nagasawa, Tokyo (JP)

(73) Assignee: ASAHI KASEI KABUSHIKI KAISHA, Tokyo (JP)

(*) Notice: Subject to any disclaimer, the term of this patent is extended or adjusted under 35 U.S.C. 154(b) by 603 days.

(21) Appl. No.: 16/635,715

(22) PCT Filed: Jul. 27, 2018

(86) PCT No.: PCT/JP2018/028315
§ 371 (c)(1),
(2) Date: Jan. 31, 2020

(87) PCT Pub. No.: WO2019/026806
PCT Pub. Date: Feb. 7, 2019

(65) Prior Publication Data
US 2021/0130649 A1    May 6, 2021

(30) Foreign Application Priority Data
Aug. 2, 2017    (JP) ................... 2017-150082

(51) Int. Cl.
| | | |
|---|---|---|
| C09D 179/08 | (2006.01) | |
| C08G 73/10 | (2006.01) | |
| C08J 5/18 | (2006.01) | |
| C08K 3/08 | (2006.01) | |
| C08K 5/1535 | (2006.01) | |

(52) U.S. Cl.
CPC ....... *C09D 179/08* (2013.01); *C08G 73/1003* (2013.01); *C08J 5/18* (2013.01); *C08K 3/08* (2013.01); *C08K 5/1535* (2013.01); *C08G 2150/00* (2013.01); *C08K 2003/085* (2013.01); *C08K 2003/0856* (2013.01); *C08K 2201/019* (2013.01)

(58) Field of Classification Search
None
See application file for complete search history.

(56) References Cited

U.S. PATENT DOCUMENTS

| | | | | |
|---|---|---|---|---|
| 2002/0016438 A1* | 2/2002 | Sugo | ...... | C08L 79/08 |
| | | | | 528/332 |
| 2013/0178597 A1* | 7/2013 | Takasawa | ...... | C08G 73/1042 |
| | | | | 528/346 |
| 2017/0309844 A1 | 10/2017 | Saeki et al. | | |
| 2018/0086939 A1 | 3/2018 | Kato et al. | | |

FOREIGN PATENT DOCUMENTS

| | | |
|---|---|---|
| JP | 2000-53862 A | 2/2000 |
| JP | 2004-107411 A | 4/2004 |
| JP | 2004-161937 A | 6/2004 |
| JP | 2006-104383 A | 4/2006 |
| JP | 2006-104384 A | 4/2006 |
| JP | 2014-088460 A | 5/2014 |
| JP | 2016-72246 A | 5/2016 |
| KR | 10-2015-0004097 A | 1/2015 |
| WO | WO 2010/098296 A1 | 9/2010 |
| WO | WO 2012/118020 A | 9/2012 |
| WO | WO 2014/024885 A1 | 2/2014 |
| WO | WO 2016/158825 A1 | 10/2016 |

OTHER PUBLICATIONS

English translation of International Preliminary Report on Patentability and Written Opinion dated Feb. 13, 2020, in PCT/JP2018/028315 (Forms PCT/IB/326, PCT/IB/373, and PCT/ISA/237).
Imai, Y. and R. Yokota, Japan Polyimide Research Group. Advanced Polyimide (Base and Application), 2002, p. 113 (with partial abstract).
International Search Report dated Oct. 30, 2018, in PCT/JP2018/028315.

* cited by examiner

Primary Examiner — Robert T Butcher
(74) Attorney, Agent, or Firm — Birch, Stewart, Kolasch & Birch, LLP

(57) ABSTRACT

The purpose of the present invention is to provide a, polyimide film having high transparency and improved bending resistance against multiple times of bending, and a varnish capable of providing such a polyimide film. The varnish according to the present invention contains a polymer (α) and a solvent (β). The polymer (α) is polyimide or a polyimide precursor. The varnish further contains a typical metal element having an atomic weight of 26-201 except alkali metals and alkaline earth metals, or at least one metal element among transition metal elements having an atomic weight of 26-201 or less. At least one of the metal elements contained in the varnish is present in an amount of 0.05-500 ppm relative to the polymer (α).

19 Claims, 2 Drawing Sheets

POLYIMIDE VARNISH AND METHOD FOR PRODUCING SAME

FIELD

The present invention relates to a polyimide varnish and a method for producing same.

BACKGROUND

In recent years, bendable devices such as a flexible display device (also referred to as "flexible display"), etc., organic EL light-emitting devices (also referred to as "organic EL lighting") or devices having a curved surface such as an organic EL display, etc., have been developed. In the bendable devices and the devices having a curved surface, it has been considered to use a bendable film as a substrate for forming a surface protective layer, a color filter, a touch panel, a TFT, etc., instead of a rigid substrate. Moreover, in a field of touch panel materials such as transparent electrode films, it has been considered to use a resin film as a substrate in substitution for a glass, from the viewpoint of weight reduction, thinning and flexibility of the film.

As the bendable film, it has been considered to use, for example, a polyethylene terephthalate film (PET film), a polyethylene naphthalate film (PEN film), and a cycloolefin film (COP film) which has excellent optical properties, etc.

On the other hand, since a polyimide resin generally has excellent properties such as heat oxidation resistance, heat resistance properties, heat radiation resistance, low temperature resistance and chemical resistance, etc., it has also been considered to use a polyimide film as the aforementioned bendable film.

CITATION LIST

Patent Literature

[PTL 1] WO 2016/158825 A1
[PTL 2] Japanese Unexamined Patent Publication (Kokai) No. 2004-161937
[PTL 3] Japanese Unexamined Patent Publication (Kokai) No. 2004-107411
[PTL 4] WO 2012/118020 A1

Non Patent Literature

[NPL 1] Japan Polyimide Research Group. *Advanced Polyimide* (Base and Application), 2002, p. 113.

SUMMARY

Technical Problem

Films used for optical devices that are required to be repeatedly bent, such as flexible display devices, etc., are required not only to be bendable but also to have excellent optical characteristics and an excellent bending resistance against multiple bending. Since the aforementioned. PET film, PEN film and COP film have a disadvantage that bending resistance thereof is low, it is difficult to use them as a substrate for such flexible optical devices.

On the other hand, since polyimide resins generally have excellent properties, such as optical properties, bending resistance, heat oxidation resistance, heat resistance properties, heat radiation properties, low temperature resistance and chemical resistance, etc., the inventors considered to use the polyimide film disclosed in Patent Document 1 as a substrate for flexible optical devices. However, it has been found that there is a room for improvement on the conventional polyimide film as described in Patent Document 1 in the bending resistance over multiple bending.

Patent Document 2 describes a polyimide film which contains at least one element(s) selected from six metal elements of sodium, magnesium, potassium, iron, nickel and copper in an amount of more than 0 ppm to 100 ppm or less in order to solve a problem of poor surface adhesion of a polyimide film. Similarly, in Patent Document 3, an amount of chromium is set to be less than 10 ppm to improve an adhesion of a polyimide film. However, since the polyimide films described in Patent Documents 2 and 3 use a monomer having a rigid skeleton, they have a low light transmittance, and are difficult to be used as a substrate for a colorless and transparent flexible optical device.

Accordingly, one of the problems to be solved by the present invention is to provide a polyimide film having a high transparency and an improved bending resistance against bending, and a varnish which can produce such a polyimide film.

Solution to Problem

The present inventors have carried out much diligent experimentation with the aim of solving the problems described above. As a result, the present inventors have found that the problems can be solved by using a varnish containing a polyimide or a polyimide precursor, wherein the varnish contains a specific typical metal element, or at least one metal element selected from metal elements among transition metal elements, at a specific amount, and thus have completed the present invention. Namely, the present invention is as described below.

[1] A varnish containing a polymer (α) and a solvent (β), wherein the polymer (α) is a polyimide or a polyimide precursor,
wherein the varnish contains at least one metal element(s) that is a typical metal element(s) having an atomic weight of from 26 to 201 except alkali metals and alkaline earth metals, or a transition metal element(s) having an atomic weight of from 26 to 201, and
wherein at least one of the metal element(s) contained in the varnish is present in an amount of from 0.05 to 500 ppm relative to the polymer (α).
[2] The varnish according to [1], therein the varnish has a light transmittance at a wavelength of 450 nm of from 60% or more which is measured at an optical path length of 10 mm when a concentration of the polymer (α) in the solvent (β) is adjusted to 20% by weight.
[3] The varnish according to [1] or [2], wherein the metal element contains at least one selected from the group consisting of Zn, Zr, Cu, Cr, Mn, Co, Pd, Ni, Rh, Al and Fe.
[4] The varnish according to any one of [1] to [3], wherein at least one of the metal element(s) contained in the varnish is present in an amount of from 0.05 to 100 ppm relative to the polymer (α).
[5] The varnish according to [3], wherein the metal element contains Zn.
[6] The varnish according to [3], wherein the metal element contains Zr.
[7] The varnish according to [3], wherein the metal element contains Cu.
[8] The varnish according to [3], wherein the metal element contains Cr.

[9] The varnish according to [3], wherein the metal element contains at least one selected from the group consisting of Mn, Co, Pd, Ni, Rh and Al.
[10] The varnish according to [3], wherein the metal element contains Fe.
[11] The varnish according to [3], wherein the metal element contains Fe, and Fe is present in an amount of from 50 ppm to 500 ppm relative to the polymer ($\alpha$).
[12] The varnish according to any one of [1] to [9], further containing a typical non-metal element selected from the group consisting of P and Si,
wherein at least one of the typical non-metal element(s) contained in the varnish is present in an amount of from 0.05 to 100 ppm relative to the polymer ($\alpha$).
[13] The varnish according to any one of [1] to [12], wherein the polymer ($\alpha$) is polyimide.
[14] The varnish according to [13], wherein the solvent ($\beta$) is $\gamma$-butyrolactone.
[15] The varnish according to [14], wherein the metal element contains Cu.
[16] The varnish according to [1], wherein the total amount of the metal element(s) contained in the varnish is 0.05 to 500 ppm relative to the polymer ($\alpha$).
[17] The varnish according to any one of [1] to [14], which is used for forming a polyimide layer of a flexible display device or a polyimide layer of an organic EL light-emitting device.
[18] A polyimide film obtained from the varnish according to any one of [1] to [17].
[19] An organic EL light-emitting device having the polyimide film according to [18].
[20] A flexible display device having the polyimide film according to [18].
[21] The flexible display device according to [20], further comprising a light source,
wherein the polyimide film is disposed at a position such that a light from the light source passes through the polyimide film and is output to an outside of the flexible device.
[22] A flexible display device having a polyimide layer containing a polymer ($\alpha$),
wherein the polyimide layer contains at least one metal element(s) that is a typical metal element(s) having an atomic weight of from 26 to 201 except alkali metals and alkaline earth metals, or a transition metal element(s) having an atomic weight of from 26 to 201, and
wherein at least one of the metal element(s) contained in the polyimide layer is present in an amount of from 0.05 to 500 ppm relative to the polymer ($\alpha$).
[23] The flexible display device according to [22], wherein at least one of the metal element(s) contained in the polyimide layer is present in an amount of from 0.05 to 100 ppm relative to the polymer ($\alpha$).
[24] The flexible display device according to [22], wherein the metal element contains at least one selected from the group consisting of Zn, Zr, Cu, Cr, Mn, Co, Pd, Ni, Rh, Al and Fe.
[25] The flexible display device according to [24], wherein the metal element contains at least one selected from the group consisting of Zn, Zr, Cu and Cr.
[26] The flexible display device according to [24], wherein the metal element contains Fe, and Fe is present in an amount of from 50 to 500 ppm relative to the polymer ($\alpha$).
[27] The flexible display device according to [22], wherein the total amount of the metal element(s) contained in the polyimide layer is from 0.05 to 500 ppm relative to the polymer ($\alpha$).
[28] The flexible display device according to [27], further comprising a light source,
wherein the polyimide layer is disposed at a position such that a light from the light source passes through the polyimide layer and is output to an outside of the flexible display device.
[29] A method for producing a polyimide varnish, comprising:
(a) dissolving diamine and acid dianhydride in a solvent to produce a polyimide precursor; and
(b) heating the polyimide precursor in the solvent to produce a polyimide;
wherein in step (b), at least one metal element(s) selected from the group consisting of Zn, Zr, Cu, Cr, Mn, Co, Pd, Ni, Rh, Al and Fe is present in the solvent.
[30] The method for producing the polyimide varnish according to [29], wherein the metal element contains Cu.

Advantageous of Effects of Invention

The present invention can provide the polyimide film with a high transparency and an improved bending resistance against multiple times of bending, and a varnish which can provide such a polyimide film. The above descriptions should not be regarded as disclosing all embodiments of the present invention and all advantages related to the present invention.

DESCRIPTION OF EMBODIMENTS

Figure 1:
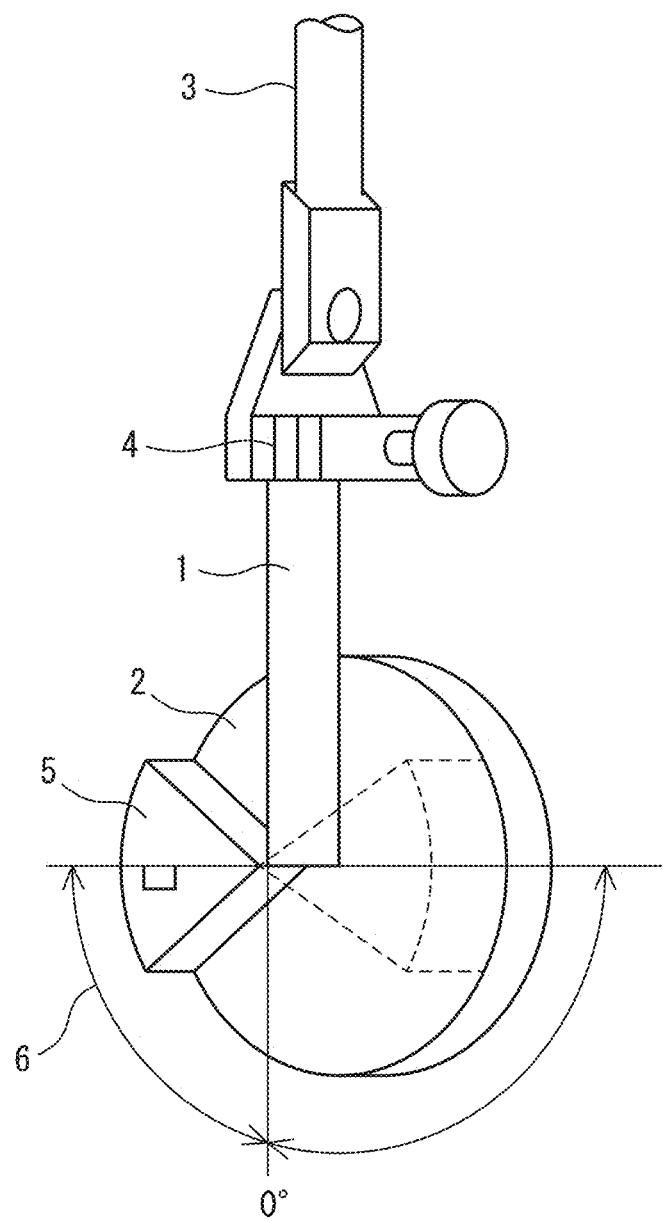
FIG. 1 is a schematic diagram illustrating an example of a bending test in the present description.

Embodiments for carrying out the invention (hereunder referred to as "the present embodiment") will now be explained in detail. It is to be understood, however, that the invention is not limited to the embodiments below and may implement various Modifications within the scope of the gist thereof. In the present description, the upper limit and lower limit of the range of various numerals can be arbitrarily combined.
Varnish
Trace Metal Element
A varnish of the present embodiment contains a polymer ($\alpha$) and a solvent ($\beta$). The varnish further contains at least one metal element (hereinafter these metal elements are also referred to as "trace metal element(s)" in the present description) selected from typical metal elements having an atomic weight of from 26 to 201 except alkali metals and alkaline earth metals, or transition metal elements having an atomic weight of from 26 to 201. Among the trace metal elements contained in the varnish, at least one element(s) is present in an amount of 0.05 to 500 ppm relative to the polymer ($\alpha$).

While it is not bound by any theory, it is assumed that polymerization reactivity of the polyimide or polyimide precursor, i.e., polymer ($\alpha$), is improved by the trace metal element contained in the varnish of the present embodiment, and thus the molecular weight of the polymer ($\alpha$) in the varnish is increased, or the molecular weight of the polymer ($\alpha$) is increased when a polyimide film is formed from the varnish, and as a result, a polyimide film having an improved bending resistance against multiple bending can be provided.

Since outermost electrons of an alkali metal and alkaline earth metal are in s orbitals, these metals may have little electronic interaction with organic molecules and have little influence on the polymerization reaction of the polymer. On the other hand, since typical metal elements or transition metal elements have outermost electrons or free electrons in p orbital or d orbital in which the spatial spread is wider than that of s orbital, these elements may produce an electronic interaction with organic molecules and have a catalytic action on the polymerization reaction of the polymer.

Among typical metal elements and transition metal elements, the trace metal element preferably contains at least one element selected from the group consisting of zinc (Zn), zirconium (Zr), copper (Cu), chromium (Cr), manganese (Mn), cobalt (Co), palladium (Pd), nickel (Ni), rhodium (Rh), aluminum (Al) and iron (Fe). The trace metal element preferably contains zinc, more preferably contains zinc and copper, further preferably contains zinc, copper and iron, even further preferably contains zinc, copper, iron and zirconium, and most preferably zinc, copper, iron, zirconium and chromium.

Although the mechanism of action of the aforementioned preferred trace metal elements for the polymerization reaction of polyimide and the polyimide precursor is unknown, it is assumed that the trace metal elements may promote the polymerization reaction by electronic interaction with organic molecules.

At least one of the trace metal elements contained in the varnish is preferably 0.05 ppm or more, more preferably 0.1 ppm or more, still more preferably 0.5 ppm or more, still more preferably 1.0 ppm or more, or still more preferably 4.0 ppm or more with respect to the polymer ($\alpha$).

At least one of the trace metal elements contained in the varnish is preferably 500 ppm or less, more preferably 400 ppm or less, more preferably 300 ppm or less, more preferably 200 ppm or less, or more preferably 100 ppm or less relative to the polymer ($\alpha$), and it may be 90 ppm or less, 80 ppm or less, 70 ppm or less, or 60 ppm or less.

The total amount of trace metal elements contained in the varnish is preferably 0.05 to 500 ppm with respect to the polymer ($\alpha$) from the viewpoint of film transparency.

When the content of the trace metal element is large, a polyimide tends to be colored. Although the mechanism of action of the trace metal element is unknown, it is assumed that the polyimide forms aggregates and complexes due to interaction with the metal element to absorb visible light and thus the polyimide tends to be colored. It is assumed that coloring with a metal oxide can cause coloring of a formed polyimide When the trace metal element contains copper, the lower limit of the amount of copper with respect to the polymer ($\alpha$) is preferably 0.05 ppm or more, more preferably 0.1 ppm or more, and still more preferably 1 ppm or more, and the upper limit is preferably 100 ppm or less, more preferably 90 ppm or less, and still more preferably 50 ppm or less.

When the trace metal element contains at least one selected from the group consisting of manganese, cobalt, palladium, nickel, rhodium and aluminum, at least one of the contained metal elements is preferably relative to the polymer ($\alpha$), 0.05 ppm or more, more preferably 0.07 ppm or more, and still more preferably 0.1 ppm or more, and preferably 500 ppm or less and more preferably 100 ppm or less.

When the trace metal element contains iron, the lower limit of the amount of iron with respect to the polymer ($\alpha$) is preferably 0.05 ppm or more and more preferably 50 ppm or more, and the upper limit is preferably 500 ppm or less and more preferably 100 ppm or less.

When the iron content is preferably in the range of 50 ppm to 100 ppm, since both the bending resistance and transparency of the film can be achieved. Since iron easily interacts with oxygen, it is assumed that the interaction between dissolved oxygen and iron in the solvent reduces electronic interaction between iron and organic molecules, which may reduce polymerization reaction promoting effect, compared with Zn, Cu, etc. Therefore, in order to sufficiently promote the polymerization reaction without complicated treatments, such as degassing of solvent, etc., adding 50 ppm or more is preferred.

When the trace metal element contains zirconium, the lower limit of the amount of zirconium with respect to the polymer ($\alpha$) is preferably 0.05 ppm or more, more preferably 0.07 ppm or more, and still more preferably 0.1 ppm or more, and the upper limit is preferably 100 ppm or less, more preferably 90 ppm or less, and still more preferably 50 ppm or less.

When the trace metal element contains zinc, the lower limit of the amount of zinc with respect to the polymer ($\alpha$) is preferably 0.05 ppm or more, more preferably 0.1 ppm or more, and still more preferably 01 ppm or more, and the upper limit is preferably 150 ppm or less, more preferably 120 ppm or less, and still more preferably 100 ppm or less.

When the trace metal element contains chromium, the lower limit of the amount of chromium relative to the polymer ($\alpha$) is preferably 0.05 ppm or more, more preferably 1.0 ppm or more, and still more preferably 2.0 ppm or more, and the upper limit is preferably 150 ppm or less, more preferably 120 ppm or less, and still more preferably 100 ppm or less.

Non-Metal Trace Elements

The varnish of the present embodiment preferably further contains 0.05 to 100 ppm of a non-metal element (also referred to as "non-metal trace element(s)" in the present description) in addition to the aforementioned trace metal element. The non-metal trace element is preferably, for example, phosphorus (P) and/or silicon (Si). When the varnish of the present embodiment contains the non-metal trace element, the strength of a polyimide film is preferably improved. The lower limit of the content of the non-metal trace element in the polymer ($\alpha$) is more preferably 0.1 ppm or more and still more preferably 1.0 ppm or more, and the upper limit is more preferably 100 ppm or less and still more preferably 50 ppm or less. Although the mechanism of action of phosphorus and/or silicon is unknown, it is assumed that phosphorus and/or silicon may interact with the aforementioned trace metal elements to further enhance the polymerization promoting effect of the trace metal elements.

Light Transmittance

The varnish of the present embodiment has a transmittance of light having a wavelength of 450 nm of 45% or more, more preferably 50% or more, more preferably 55% or more, still more preferably 60% or more, still more preferably 70% or more, or still more preferably 80% or more, which is measured at an optical path length of 10 min and 20% by weight of the solid content concentration of the varnish in a solvent. The upper limit of the transmittance of light having a wavelength of 450 nm is not particularly limited, but may be less than 100%, 99% or less, 98% or less, 95% or less, or 90% or less.

The polyimide varnish of the present embodiment has a transmittance of light having a wavelength of 400 nm of 5% or more, preferably 10% or more, more preferably 20% or more, still more preferably 30% or more, still more preferably 40% or more, or still more preferably 50% or more, which is measured at an optical path length of 10 mm and 20% by weight of the solid content concentration of the varnish in the solvent. The upper limit of the transmittance of light having a wavelength of 400 nm is not particularly limited, but may be less than 100%, 90% or less, 80% or less, or 70% or less.

Based on having the above features in addition to having an improved bending resistance against multiple bending, the varnish of the present embodiment can be suitably used as a film substrate of a flexible optical device. The method for adjusting the light transmittance to the above ranges is not limited, but the light transmittance can be adjusted by changing the type of the solvent contained in the varnish, the type and amount of the diamine and acid dianhydride monomer units constituting the polyimide or polyimide precursor, the molecular weight of the polyimide or polyimide precursor, the type and amount, etc., of arbitrary additives. For example, the light transmittance can be more easily adjusted within the above range, by using the polyimide represented by formula (1) described below.

Solvent

Solvent (β) is not particularly limited. Polar solvents are useful as the solvent, and examples thereof include phenol-based solvents, amide-based solvents, lactone-based solvents, sulfoxide-based solvents, ketone-based solvents, and ester-based solvents. Examples of the phenol-based solvent include m-cresol. Examples of the amide-based solvent include N-methyl-2-pyrrolidone (NMP), N, N-dimethylformamide (DMF), and, N, N-dimethylacetamide (DMAc). Examples of the lactone-based solvent include γ-butyrolactone (GBL), δ-valerolactone, ε-caprolactone, γ-crotonolactone, γ-hexanolactone, α-methyl-γ-butyrolactone, γ-valerolactone, α-acetyl-γ-butyrolactone, and δ-hexanolactone. Examples of the sulfoxide-based solvent include N, N-dimethyl sulfoxide (DMSO). Examples of the ketone-based solvent include acetone, methyl ethyl ketone, methyl isobutyl ketone, and cyclohexanone. Examples of the ester-based solvent include methyl acetate, ethyl acetate, butyl acetate, and dimethyl carbonate. Among them, NMP and GBL are preferable from the viewpoint of solubility. From the viewpoint of further reducing the yellow index (YI) of the film, GBL is more preferable.

Polymer (α)

In the present embodiment, the polymer (α) contained in the varnish is a polyimide or a polyimide precursor. The lower limit of the molar ratio of the diamine to the acid dianhydride, both of which are contained as polymerization units in the polyimide or polyimide precursor, is preferably 0.95 or more, more preferably 0.96 or more, still more preferably 0.965 or more, even still more preferably 0.97 or more, and the upper limit is less than 1.00, more preferably less than 0.995, still more preferably less than 0.993, and even still more preferably less than 0.99. The molar ratio of the diamine to the acid dianhydride, both of which are contained as polymerization units in the polyimide or polyimide precursor, is preferably 0.95 or more and less than 1.00, since defects in a coating of the varnish are suppressed, and high transparency is obtained.

The varnish of the present embodiment is either a polyimide varnish (i.e., at least a part of the polymer (α) is polyamide.) or a polyimide precursor varnish (i.e., the polymer (α) is a polyimide precursor.). From the viewpoint of the strength of the intermediate film (film without a sticky surface after rough drying) when processed from a varnish to a roll film, the polyimide varnish is preferred. In the case of the polyimide varnish, the intermediate film is resistant to breakage when processed it into a roll film, and is easily applied to a roll film processing.

The varnish according to the present embodiment preferably contains a polyimide represented by the following formula (1) or a precursor thereof, as the polymer (α).

[Chemical formula 1]

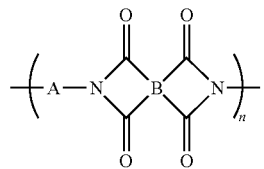

(1)

wherein A is a divalent organic group, B is a tetravalent organic group, and n is 2 or greater.

A in Formula (1)

The polyimide contained in a polyimide varnish can be prepared from an acid dianhydride and a diamine as raw materials. A in formula (1) can be obtained from a diamine.

Moreover, in the present embodiment, as A in formula (1), at least one stricture(s) selected from the structures represented by the following formula (A-1), the following formula (A-2), the following formula (A-3), and the following formula (A-4), is preferably contained.

[Chemical formula 2]

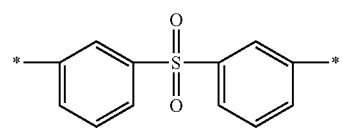

(A-1)

[Chemical formula 3]

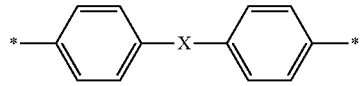

(A-2)

wherein X is a divalent organic group selected from the following formulas (X-1) to (X-3).

[Chemical formula 4]

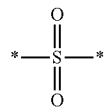

(X-1)

[Chemical formula 5]

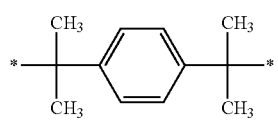

(X-2)

[Chemical formula 6]

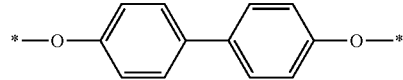

(X-3)

[Chemical formula 7]

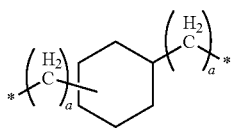
(A-3)

wherein a is 0 or 1.

[Chemical formula 8]

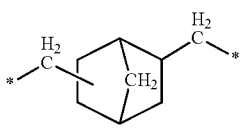
(A-4)

The structure represented by formula (A-1) is derived from 3,3'-diaminodiphenyl sulfone (hereinafter, also referred to as 3,3'-DDS), the structure (corresponding to formula (A-5)) represented by combining formulas (A-2) and (X-1) is derived from 4,4'-diaminodiphenyl sulfone (hereinafter referred to as 4,4'-DDS), the structure represented by combination of formulas (A-2) and (X-2) is derived from α, α'-bis(4-aminophenyl)-1,4-diisopropylbenzene (hereinafter also referred to as BAPDB), the structure represented by combination of formulas (A-2) and (X-3) is derived from 4,4'-bis(4-aminophenoxybiphenyl) (hereinafter also referred to as BAPB), the structure represented by formula (A-3) is derived from cyclohexyldiamine (hereinafter also referred to as CHDA) when a is 0, and 1,4-bis(aminomethyl)cyclohexane (hereinafter also referred to as 14BAC) when a is 1, and the structure represented by formula (A-4) is derived from bis(aminomethyl)norbornane (hereinafter also referred to as BANBDA). However, the aforementioned structures are not limited to these compounds. Formula (A-5) of the combination of formulas (A-2) and (X-1) is shown below.

[Chemical formula 9]

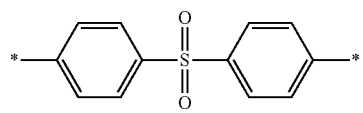
(A-5)

Formula (A-6) of the combination of formulas (A-2) and (X-2) is shown below.

[Chemical formula 10]

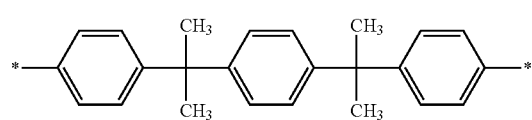
(A-6)

Formula (A-7) of the combination of formulas (A-2) and (X-3) is shown below.

[Chemical formula 11]

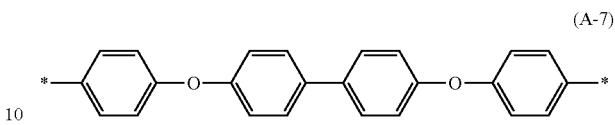
(A-7)

The polyimide varnish in the present embodiment preferably comprises a polyimide which comprises, as A in formula (1), the structure represented by formula (A-1) (derived fro 3,3'-diaminodiphenyl sulfone) as an essential repeating unit and further comprises, as a repeating unit combined with formula (A-1), any one or more of structures represented by formula (A-2), formula (A-3) and formula (A-4).

The polyimide of the present embodiment, which is contained in the polyimide varnish, contains the repeating units as described above, and thus can provide a polyimide film having a low Yellow Index (hereinafter also referred to as "YI") and a small retardation (hereinafter also referred to as "Rth"), and being excellent in bending resistance. YI is preferably as low as possible. If YI is low, coloring of a polyimide film can be reduced and visibility of a touch panel, organic EL light-emitting device, flexible display device, etc., can be improved. Therefore, it is preferable to reduce the YI as low as possible and increase the total light transmittance of visible light. It has been said that the coloring of polyimide is derived from formation of a charge transfer complex (hereinafter also referred to as "CT complex") of intramolecular and intermolecular polyimides. It is assumed that all of the structures represented by formulas (A-1) to (A-4) may inhibit the formation of an intermolecular polyimide CT complex due to bending of the backbone chain. Among others, the structures represented by formulas (A-1) and (A-5) are particularly preferred, since they can weaken electron-donating property of the N atom of the imide group due to electron-withdrawing property of the $SO_2$ group, which may make the formation of CT complex difficult.

Absorption of visible light by an aromatic polyimide also causes coloring of the polyimide. It is assumed that the alicyclic structures of formulas (A-3) and (A-4) can reduce the absorption of visible light due to few conjugated π electrons, as compared with the aromatic polyimide.

The lower orientation a polyimide has, the more improved solubility the polyimide may have. It is assumed that the structures represented by formulas (A-1) to (A-4), respectively, can exhibit excellent solubility because the orientation of the polyimide molecules is lowered due to bending of the backbone chain. In particular, the structure represented by formula (A-1) exhibits excellent solubility, since it has a significantly low orientation of the polyimide molecules due to coexistence of the bending structure of the $SO_2$ group and the bending structure of the 3- and 3'-positions.

As described above, the polyimide contained in the polyimide film in the present embodiment preferably contains, as A in formula (1), the structure represented by formula (A-1) and one or more of the structures represented by formula (A-2), formula (A-3) and formula (A-4).

By copolymerizing the structure represented by formula (A-1) and the structure represented by formula (A-5), the molecular weight of the polyimide is increased and the bending resistance of the film formed using this polyimide is further improved. In addition, the same effect can be derived from a polyimide having the structure represented by formula (A-1) and at least one or more of structure(s) selected from the structures represented by formulas (A-2), (A-3) and (A-4).

In the present embodiment, it is preferable to use the structure represented by formula (A-1) and the structure represented by formula (A-5). Hereinafter, embodiments in which both 3,3'-DDS and 4,4'-DDS are used as diamines are described.

The constituent unit represented by formula (A-1), as described above, can be obtained from the 3,3'-DDS component. The structure represented by formula (A-1) is a site that exhibits solubility to a solvent.

The constituent unit represented by formula (A-5) can be obtained from 4,4'-DDS. The structure represented by formula (A-5) can lead to a polyimide film, which have a glass transition temperature (Tg) in a range of 250 to 350° C. in the form of a polyimide film obtained by heating and drying a varnish obtained by dissolving the polyimide of the present embodiment in a solvent.

In the present embodiment, containing both the structure represented by formula (A-1) and the structure represented by formula (A-5) is preferable. The structural unit represented by formula (A-1) is preferably contained from the viewpoint of solubility of the polyimide. The structural unit represented by formula (A-5) is preferred from the viewpoint of a high glass transition temperature (Tg). By containing both the structure represented by formula (A-1) and the structure represented by formula (A-5), the solubility of the polyimide, elongation at break of the film, and high glass transition temperature (Tg) can be obtained without impairing colorless transparency and high total light transmittance, which are unachievable by each structure individually.

In order to reduce the Rth of the film, it is necessary to reduce the difference between the refractive index in the in-plane direction and the refractive index in the out-of-plane direction of the film. Although not bounded by any theory, the structure represented by formula (A-1) and formula (A-5) are structures in which the $SO_2$ group is bending and the electrons thereof are on $sp^2$ orbits, so that the bending structure is fixed. Therefore, as described above, the orientation of the polyimide molecules is lowered, and it is assumed that even when a varnish is coated to prepare a film, the structure represented by formula (A-1) and the aromatic group contained in formula (A-5) may not be aligned in one direction and be present at random. Namely, if the structure represented by formula (A-1) and formula (A-5) are present in a polyimide backbone, the difference between the refractive index in the in-plane direction and the refractive index in the out-of-plane direction is reduced, and the Rth of the film may be reduced.

In the present embodiment, from the viewpoint of improving bending resistance of a polyimide film, the composition ratio ((A-1)/(A-2) to (A-4)) of the structure of formula (A-1) to the structure of formulas (A-2) to (A-4), respectively, is preferably 2/8 to 8/2 in terms of molar ratio. In particular, when having the structure represented by formula (A-5) as formula (A-2), the composition ratio ((A-1)/(A-5)) of the structure of formula (A-1) to the structure of formula (A-5) is preferably in the range of from 2/8 to 6/4, and more preferably in the range of from 3/7 to 4/6 in terms of molar ratio. Accordingly, the formula (A-1) component is preferably 20% by mole or more and 60% by mole or less when the total amount of A in formula (1) is 100% by mole. The formula (A-5) component is preferably 40% by mole or more and 80% by mole or less when the total amount of A in formula (1) is 100% by mole.

Moreover, the polyimide has the structure of (A-1) and at least one of the structures of formula (A-2)[*1] to formula (A-4) (*1: provided that formula (A-5) is excluded), these composition ratios ((A-1)/(A-2)* to (A-4)) (*1: provided that formula (A-5) is excluded) are preferably 5/5 to 8/2 in terms of molar ratio.

As described above, a polyimide comprising only the structure derived from the 4,4'-DDS component (structure represented by formula (A-5)) has a low molecular weight, and thus has a low bending resistance of the film. For this reason, in the present embodiment, a polyimide may further comprises the structure derived from the 3,3'-DDS component (structure represented by formula (A-1)), which is an isomer derived from the 4,4'-DDS component and has a bending structure of the monomer skeleton relative to the structure derived from the 4,4'-DDS component. In this case, the amount of the 3,3'-DDS derived component is preferably smaller than the amount of the 4,4'-DDS derived component, which can improve the bending resistance while increasing the molecular weight.

In a range where a desired elongation at break can be exhibited, more preferably in a range where the targeted glass transition temperature (Tg) can be provided, a structural unit except for formulas (A-1) and (A-5) can be comprised in a small amount. Namely, the polyimide according to the present embodiment may contain a constituent unit derived from a diamine component other than 4,4'-DDS and 3,3'-DDS without impairing performances of the polyimide. For example, an aromatic diamine having 6 to 30 carbon atoms can be included in a preferred embodiment.

Specifically, examples thereof may include structural units derived from aromatic diamines such as 2,2'-bis(trifluoromethyl)benzidine (TFMB), 1,4-diaminobenzene, 4-aminobenzenesulfonic acid-4-aminophenyl ester, 4-aminobenzenesulfonic acid-3-aminophenyl ester, 3-aminobenzenesulfonic acid-3-aminophenyl ester, 2-aminobenzenesulfonic acid-2-aminophenyl ester, 2,2'-dimethyl-4,4'-diaminobiphenyl, 1,3-diaminobenzene, 4-aminophenyl-4'-aminobenzoate, 4,4'-diaminobenzoate, 4,4'-(or 3,4'-, 3,3'-, 2,4'-)diaminodiphenyl ether, 4,4'-(or 3,3'-)diaminodiphenyl sulfide, 4,4'-benzophenonediamine, 3,3'-benzophenone diamine, 4,4'-di(4-aminophenoxy)phenyl sulfone, 4,4'-di(3-aminophenoxy)phenyl sulfone, 4,4'-bis(4-aminophenoxy) biphenyl, 1,4-bis(4-aminophenoxy)benzene, 1,3-bis(4-aminophenoxy)benzene, 2,2'-bis(4-(4-aminophenoxy)phenyl) propane, 3,3',5,5'-tetramethyl-4,4'-diaminodiphenylmethane, 2,2'-bis(4-aminophenyl)propane, 2,2',6,6'-tetramethyl-4,4'-diaminobiphenyl, 2,2',6,6'-tetratrifluoromethyl-4,4'-diaminobiphenyl, bis{(4-aminophenyl)-2-propyl}-1,4-benzene, 9,9-bis(4-aminophenyl)fluorene, 9,9-bis(4-aminophenoxyphenyl)fluorene, 3,3'-dimethylbenzidine, 3,3'-dimethoxybenzidine and 3,5-diaminobenzoic acid, 2,6-diaminopyridine, 2,4-diaminopyridine, bis(4-aminophenyl-2-propyl)-1,4-benzene, 3,3'-bis(trifluoromethyl)-4,4'-diaminobiphenyl (3,3'-TFDB), 2,2'-bis[3-(3-aminophenoxy)phenyl]hexafluoropropane (3-BDAF), 2,2'-bis[4-(4-aminophenoxy)phenyl]hexafluoropropane (4-BDAF), 2,2'-bis(3-aminophenyl)hexafluoropropane (3,3'-6F), 2,2'-bis(4-aminophenyl)hexafluoropropane (4,4'-6F), etc.

9,9-bis(4-aminophenyl)fluorene and 9,9-bis(4-aminophenoxyphenyl)fluorene has a fluorene skeleton with a negative intrinsic birefringence, and can be incorporated to adjust the Rth.

Moreover, 2,2'-bis(trifluoromethyl)benzidine (TFMB), 3,3'-bis(trifluoromethyl)-4,4'-diaminobiphenyl (3,3'-TFDB), 2,2'-bis[3-(3-aminophenoxy)phenyl]hexafluoropropane (3-BDAF), 2,2'-bis[4-(4-aminophenoxy)phenyl]hexafluoropropane (4-BDAF), 2,2'-bis(3-aminophenyl)hexafluoropropane (3,3'-6F) and 2,2'-bis(4-aminophenyl)hexafluoropropane (4,4'-6F) can inhibit the formation of an intermolecular polyimide CT complex due to the highly sterically hindered fluorine atoms, and thus can be introduced to reduce the YI of the film.

The structural unit derived from 2,2'-bis(trifluoromethyl) benzidine (TFMB) is represented by the following formula (A-8).

[Chemical formula 12]

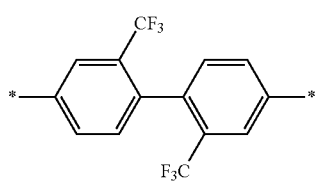

(A-8)

B in Formula (1)

Now, B in formula (1) is explained below. The structural unit of B in Formula (1) can be obtained from an acid dianhydride.

In the present embodiment, a structural unit derived from acid dianhydride components contained in the polyimide may be the same molecules or a molecule having a different structures.

The structural unit represented by B is preferably a structural unit represented by formula (B-1) to formula (B-4).

In the present embodiment, at least one of the structures represented by the following formula (B-1) to the following formula (B-4) is preferably contained as B in formula (1).

[Chemical formula 13]

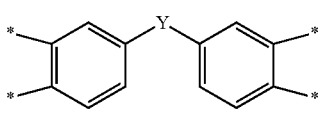

(B-1)

wherein Y is either one of the structure selected from the following formula (Y-1) to the following formula (Y-3).

[Chemical formula 14]

*—O—*  (Y-1)

[Chemical formula 15]

(Y-2)

[Chemical formula 16]

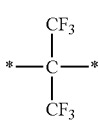

(Y-3)

[Chemical formula 17]

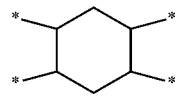

(B-2)

[Chemical formula 18]

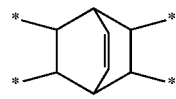

(B-3)

[Chemical formula 19]

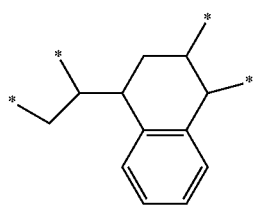

(B-4)

The structure (corresponding to the structure of formula (B-5)) represented by the combination of formulas (B-1) and (Y-1) is derived from 4,4'-oxydiphthalic dianhydride (hereinafter also referred to as ODPA), the structure represented by the combination of formula (B-1) and formula (Y-2) is derived from 4,4'-(hexafluoroisopropylidene)diphthalic dianhydride (hereinafter also referred to as 6FDA), the structure represented by the combination of formula (B-1) and formula (Y-3) is derived from 9,9-diphenylfluorene acid dianhydride (hereinafter also referred to as DPFLDA), the structure represented by formula (B-2) is derived from hydroxypyromellitic dianhydride (hereinafter also referred to as HPMDA), the structure represented by formula (B-3) is derived from bicyclo[2,2,2]oct-7-ene-2,3,5,6-tetracarboxylic dianhydride (hereinafter referred to as BODA or BCDA), and the structure represented by formula (B4) is derived from 1,3,3a,4,5,9b-hexahydro-5-(tetrahydro-2,5-dioxo-3-furanyl)naphtho[1,2-c]furan-1,3-dione (hereinafter also referred to as TDA).

DPFLDA can be introduced to adjust the Rth because the fluorene skeleton has a negative intrinsic birefringence.

The polyimide according to the present embodiment may contain a structural unit derived from an acid dianhydride component other than the structural units represented by the above formulas (B-1) to (B-4), provided that performances of the polyimide are not impaired.

For example, a compound selected from aromatic tetracarboxylic dianhydride having 8 to 36 carbon atoms, aliphatic tetracarboxylic dianhydride having 6 to 50 carbon atoms, and alicyclic tetracarboxylic dianhydride having 6 to 36 carbon atoms is preferable. The number of carbons herein includes the number of carbons contained in the carboxyl group.

More specifically, examples of aromatic tetracarboxylic dianhydride having 8 to 36 carbon atoms may include 4, pyromellitic dianhydride (hereinafter also referred to as PMDA) 1,2,3,4-benzenetetracarboxylic dianhydride, 3,3',4, 4'-bezophenone tetracarboxylic dianhydride, 2,2',3,3'-benzophenone tetracarboxylic dianhydride, 3,3',4,4'-biphenyltetracarboxylic dianhydride (hereinafter also referred to as BPDA), 3,3',4,4'-diphenysulfonetetracarboxylic dianhydride, 2,2',3,3'-biphenyltetracarboxylic dianhydride, methylene-4,4'-diphthalic dianhydride, 1,1'-ethylidene-4,4'-diphthalic dianhydride, 2,2'-propylidene-4,4'-diphthalic dianhydride, 1,2-ethylene-4,4'-diphthalic dianhydride, 1,3-trimethylene-4,4'-diphthalic dianhydride, 1,4-tetramethylene-4,4'-diphthalic dianhydride, 1,5-pentamethylene-4,4'-diphthalic dianhydride, thio-4,4'-diphthalic dianhydride, sulfonyl-4,4'-diphthalic dianhydride, 1,3-bis(3,4-dicarboxyphenyl)benzene dianhydride, 1,3-bis(3,4-dicarboxyphenoxy)benzene dianhydride, 1,4-bis(3,4-dicarboxyphenoxy)benzene dianhydride, 1,3-bis[2-(3,4-dicarboxyphenyl)-2-propyl]benzene dianhydride, 1,4-bis[2-(3,4-dicarboxyphenyl)-2-propyl]benzene dianhydride, bis[3-(3,4-dicarboxyphenoxy)phenyl]methane dianhydride, bis[4-(3,4-dicarboxyphenoxy)phenyl]methane dianhydride, 2,2'-bis[3-(3,4-dicarboxyphenoxy)phenyl]propane dianhydride, 2,2'-bis[4-(3,4-dicarboxyphenoxy)phenyl]propane dianhydride (hereinafter also referred to as BPADA), bis(3,4-dicarboxyphenoxy)dimethylsilane dianhydride, 1,3-bis(3,4-dicarboxyphenyl)-1,1',3,3'-tetramethyldisiloxane dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 3,4,9,10-perylenetetracarboxylic dianhydride, 2,3,6,7-anthracenetetracarboxylic dianhydride, 1,2,7,8-phenanthrenetetracarboxylic dianhydride, etc.

Examples of aliphatic tetracarboxylic dianhydride having 6 to 50 carbon atoms may include ethylene tetracarboxylic dianhydride, 1,2,3,4-butanetetracarboxylic dianhydride, etc.

Examples of alicyclic tetracarboxylic dianhydride having 6 to 36 carbon atoms may include 1,2,3,4-cyclobutanetetracarboxylic dianhydride (hereinafter also referred to as CBDA), cyclopentanetetracarboxylic dianhydride, cyclohexane-1,2,3,4-tetracarboxylic dianhydride, 3,3',4,4'-bicyclohexyltetracarboxylic dianhydride, carbonyl-4,4'-bis(cyclohexane-1,2-dicarboxylic acid) dianhydride, methylene-4,4'-bis(cyclohexane-1,2-dicarboxylic acid) dianhydride, 1,2-ethylene-4,4'-bis(cyclohexane-1,2-dicarboxylic acid) dianhydride, 1,1'-ethylidene-4,4'-bis(cyclohexane-1,2-dicarboxylic acid) dianhydride, 2,2'-propylidene-4,4'-bis(cyclohexane-1,2-dicarboxylic acid) dianhydride, oxy-4,4'-bis(cyclohexane-1,2-dicarboxylic acid) dianhydride, thio-4,4'-bis(cyclohexane-1,2-dicarboxylic acid) dianhydride, sulfonyl-4,4'-bis(cyclohexane-1,2-dicarboxylic acid) dianhydride, rel-[1S, 5R, 6R]-3-oxabicyclo[3,2,1]octane-2,4-dione-6-spiro-3'-(tetrahydrofuran-2',5'-dione), 4-(2,5-dioxotetrahydrofuran-3-yl)-1,2,3,4-tetrahydronaphthalene-1,2-dicarboxylic dianhydride, ethylene glycol-bis-(3,4-dicarboxylic dianhydride phenyl) ether, 4,4'-biphenylbis(trimellitic acid monoester acid anhydride), etc.

In the above formula (B-1), formula (Y-1) and formula (Y-2) are preferable from the viewpoint of improving solubility of the polyimide in a solvent and reducing YI and retardation (Rth) in the form of a polyimide film. Further, formula (Y-3) has a negative intrinsic birefringence, formula (Y-3) is preferable from the viewpoint of reducing YI and retardation (Rth) and improving the glass transition temperature (Tg) when formed into a polyimide film.

The above formulas (B-2) to (B-4) are preferable from the viewpoint of improving solubility of the polyimide in a solvent and reducing YI in the form of a polyimide film.

From the viewpoint of improving the solubility of the polyimide in a solvent, increasing total light transmittance, reducing YI, increasing elastic modulus, and increasing elongation at break in the form of a polyimide film B in formula (1) preferably contains, in particular, the structure represented by formula (B-5) derived from the ODPA component. In the polyimide represented by formula (1), the formula (B-5) component in the structural unit B derived from acid dianhydride, is preferably 50 mol % or more, more preferably 80 mol % or more, and may be 100 mol % relative to total acid dianhydride.

[Chemical formula 20]

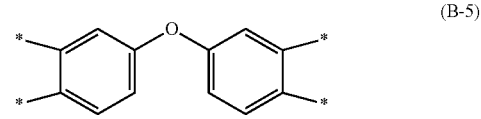

(B-5)

The polyimide according to the present embodiment preferably contains unit 1 represented by the following formula (2) and unit 2 represented by the following formula (3) as main components.

[Chemical formula 21]

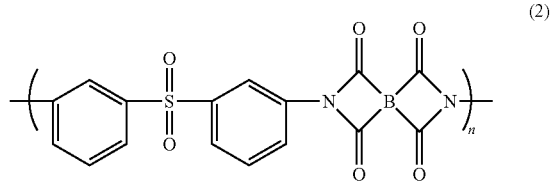

(2)

[Chemical formula 22]

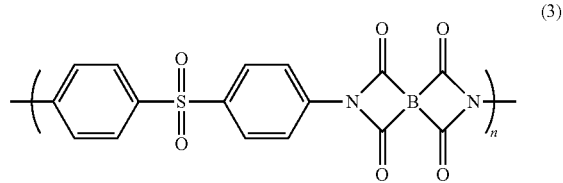

(3)

In the present embodiment, when a unit other than unit 1 and unit 2 is further contained, the content of the unit other than unit 1 and unit 2 is preferably less than the contents of unit 1 and unit 2. These units may be bonded alternately or in a permutation or may be bonded at random in the polymer chain.

The weight-average molecular weight (Mw) of polyimide is preferably 10,000 or more, more preferably 25,000 or more, and particularly preferably 30,000 or more from the viewpoint of obtaining high elongation at break and low Rth in the polyimide film. Moreover, the weight-average molecular weight (Mw) of polyimide is preferably 1,000,000 or less, more preferably 500,000 or less, and particularly preferably 250,000 or less. The weight-average molecular weight is preferably 1,000,000 or less, since the solubility in a solvent is favorable, and a film having a desired film thickness can be coated without blurring by a process, such as coating, and a film having a low Rth can be obtained. In particular, from the viewpoint of obtaining a polyimide film having a high elongation at break and a low Rth, the weight-average molecular weight is preferably 30,000 or more. The weight-average molecular weight herein is referred to as a molecular weight measured by gel permeation chromatography (hereinafter also referred to as "GPC") using polystyrene having a known number-average molecular weight as a standard.

The polyimide represented by the above formula (1) has been proved to have excellent solubility in a solvent in the Examples described below. Therefore, by using the polyimide represented by formula (1), a varnish having desired characteristics can be obtained by a simple process. According to the polyimide varnish of the present embodiment, since s polyimide is appropriately dissolved therein, a gel-like substance is not generated and a film having excellent smoothness can be formed when a coating surface is coated with the varnish. For this reason, while forming a resin layer with uniform thickness, a high bending resistance can be achieved.

Polyimide Varnish Production Method

The method for producing the polyimide varnish of the present embodiment comprises: (a) dissolving a diamine and an acid dianhydride in a solvent to prepare a polyimide precursor, and (b) heating the aforementioned polyimide precursor to form a polyimide. In one embodiment, a polyimide varnish can be produced as a polyimide solution containing the polyimide and the solvent, for example, by (a) dissolving an acid dianhydride component and a diamine component in a solvent, such as an organic solvent, to form a polyimide precursor and (b) adding an azeotropic solvent, such as toluene, and heating the polyimide precursor to from a polyimide while removing water generated upon the imidization out of the system.

The method and timing of adding the trace metal element and arbitrary non-metal trace element are not limited. Regarding the step of adding, the trace metal element and the non-metal trace element may also be added together with raw materials used for the production of the polyimide varnish, such as a solvent, diamine, and/or acid dianhydride, etc. Additionally, or alternatively, the trace metal element and non-metal trace element may be added separately from the raw materials used in the production of the polyimide varnish. Regarding the timing of addition, the trace metal element and non-metal trace element can be added before the aforementioned step (a), during step (a), after step (a) and before step (b), during step (b), and/or after step (b). Preferably, in step (b), the trace metal element and non-metal trace element are rendered present in the solvent. More preferably, the trace metal element and non-metal trace element are present in the solvent during step (b) by adding them in the solvent together with the diamine in step (a). Without being bounded by any theory, it is assumed that the presence of the trace metal element in a solvent in step (b) enhances reactivity between the diamine and acid dianhydride, and increases the molecular weight of the polyimide, and thus the bending resistance against multiple bending is improved. The amounts of the trace metal element and non-metal trace element to be added can be adjusted such that the amounts of these elements with respect to the polymer (a) are equivalent to those as explained in the section "Varnish".

The conditions upon the reaction in step (b) are not particularly limited, but for example, the reaction temperature may be 0° C. to 250° C. and the reaction time may be 3 to 72 hours. In order to sufficiently proceed the reaction with sulfone group-containing diamines, it is preferable to carry out a heating reaction at 180° C. to 200° C. for about 12 hours. Further, an inert atmosphere, such as using argon or nitrogen, etc., is preferable upon reaction.

As the solvent (p) for a varnish in the present embodiment, the solvent (reaction solvent) used for polymerizing a polyimide can be used as it is. The reaction solvent is not particularly limited provided that it is a solvent that dissolves a polyimide. Polar solvents are useful as the reaction solvent, and examples of the polar solvent include a phenol-based solvent, amide-based solvent, lactone-based solvent, sulfoxide-based solvent, ketone-based solvent, and ester-based solvent. Examples of the phenol-based solvent include m-cresol. Examples of the amide-based solvent include N-methyl-2-pyrrolidone (NMP), N, N-dimethylformamide (DMF), and N, N-dimethylacetamide (DMAc). Examples of the lactone-based solvent include γ-butyrolactone (GBL), δ-valerolactone, ε-caprolactone, γ-crotonolactone, γ-hexanolactone, α-methyl-γ-butyrolactone, γ-valerolactone, α-acetyl-γ-butyrolactone, and δ-hexanolactone. Examples of the sulfoxide-based solvent include N, N-dimethyl sulfoxide (DMSO). Examples of the ketone-based solvent include acetone, methyl ethyl ketone, methyl isobutyl ketone, and cyclohexanone. Examples of the ester-based solvent include methyl acetate, ethyl acetate, butyl acetate, and dimethyl carbonate. Among these, NMP and GBL are preferable from the viewpoint of solubility. From the viewpoint of further reducing the YI of the film, GBL is more preferable.

The varnish in the present embodiment may contain additives as appropriate. Examples of the additive include a substance exhibiting a negative birefringence, for example, inorganic particles such as strontium carbonate, etc.; and organic compounds such as polystyrene, polyvinyl naphthalene, polymethyl methacrylate, cellulose triacetate, fluorene derivatives, etc.

Examples of the additive include a leveling agent, dispersant, and surfactant for improving coatability of a varnish; a surfactant for adjusting the stripping property from a film support and adhesiveness thereof and adhesion assistant; flame retardant for imparting flame retardancy to the film, etc. Other additives may include, for example, antioxidants, ultraviolet light inhibitors, light stabilizers, plasticizers, waxes, fillers, pigments, dyes, foaming agents, antifoaming agents, dehydrating agents, antistatic agents, antibacterial agents, antifungal agents, crosslinking agents, heat stabilizers, imidizing agents, etc.

Since one single additive may serve as a plurality of usages, as is the case with a phosphoric ester compound, which has both a plasticizing effect and flame retardant effect, the additive are not limited to any particular usage, but may have structures of the following compounds, such as a phosphite-based compound, phenol-based compound, thioether-based compound, hydrazine-based compound, amide-based compound, benzotriazole-based compound, triazine-based compound, isocyanuric acid-based compound, hindered amine-based compound, hindered phenol-based compound, phosphate ester-based compound, phosphazene-based compound, urethane-based compound, acrylic-based compound, methacrylic-based compound, epoxy-based compound, isocyanate-based compound, etc.

Additives added to the polyimide varnish may be contained in the polyimide film as it is.

Polyimide Film

The polyimide film of the present embodiment is obtained from the varnish of the present embodiment described above. The polyimide film of the present embodiment may be a polyimide film containing a polyimide as a main component. The structure of the polyimide corresponds to the structure of the polyimide described in the above section "Varnish". In the description of the present application, a film "containing a polyimide as a main component" means that it contains 50% by weight or more of the polyimide based on the total weight of the film. The polyimide film preferably contains 60% by weight or more of polyimide, more preferably 70% by weight or more, still more preferably 80% by weight or more, even still more preferably 90% by weight or more relative to the total weight of the film, and particularly preferably, it is consisted of a polyimide film.

The polyimide film according to the present embodiment may be, for example, a polyimide film formed on a surface of a support, or a supportable film (self-supporting film), which can stand by itself even without any support. The polyimide film of the present embodiment is preferably a supportable film (self-supporting film), which can stand by itself even without any support, from the viewpoint of maintaining strength as a film substrate. In the description of the present application, the supportable film refers to a film having an elongation at break of 5% or more. As for a polyimide film having a support, when the polyimide film from which the support was stripped has an elongation at break of 5% or more, it is regarded as a supportable film.

Note that the elongation at break can be measured by the method described below (evaluations of elongation at break and strength at break). The polyimide film of the present embodiment can be used as an alternative to glass as is the case with a PET film and COP film, and since the polyimide film of the present embodiment has excellent bending resistance, it can hardly incur damages, even if the polyimide of the present embodiment is used for, for example, a foldable display body or a display body that follows a curved surface, which is convenient to use.

Bending Resistance

It is preferred that the polyimide film of the present embodiment does not break when it is bent 100,000 times under the conditions of a bending radius of 2 mm, bending angle of 135°, and load of 0.625 kg/m$^2$, and there is no visible bending trace left. When the polyimide film of the present embodiment has this feature, it can be more suitably used as a substrate for a flexible optical device.

Such bending resistance can be tested by any method provided that the above conditions are satisfied, and the test can be carried out, for example, as shown in FIG. 1. The size of film (1) to be tested can be 10 to 20 mm in width, 110 mm in length, and 5 to 20 sm in thickness. As shown in FIG. 1, film (1) to be tested is sandwiched between chucks (4) attached to plunger (3) that is disposed on the top of turntable (2), and film (1) is hung down through the center of turntable (2). Film (1) is sandwiched between two clamps (5) so that the two clamps (5) attached to turntable (2) are in contact with film (1) at the rotation center of turntable (2). The tip of the clamp has a curved surface with a radius of 2 mm, which allows film (1) to be bent at a bending radius of 2 mm. A weight can be set at the tip of plunger (3), and a load of 1.25 kg/m$^2$ can be applied to film (1) by adjusting a weight of the weight. Turntable (2) can repeatedly rotate by switching the direction of the turntable to left and right. The position of the lower end of the film in the start position is set as the start point (0°), and turntable (2) is rotated to left (or right). Along with the rotation of turntable (2), the lower end of the film is lifted upward while being sandwiched by clamps (5), and film (1) bends while contacting clamp (5). When bending angle (6) reaches 135°, the rotation direction of turntable (2) is switched to the opposite direction. When film (1) passes the start point and bending angle (6) reaches 135° again toward the opposite direction, the rotation direction of turntable (2) is switched again. One time of bending refers to the movement of film (1) starting from the start point to 135° to the right (or left), then to 135° to the left (or right) via the start point, and coming back to the start point.

Figure 2:
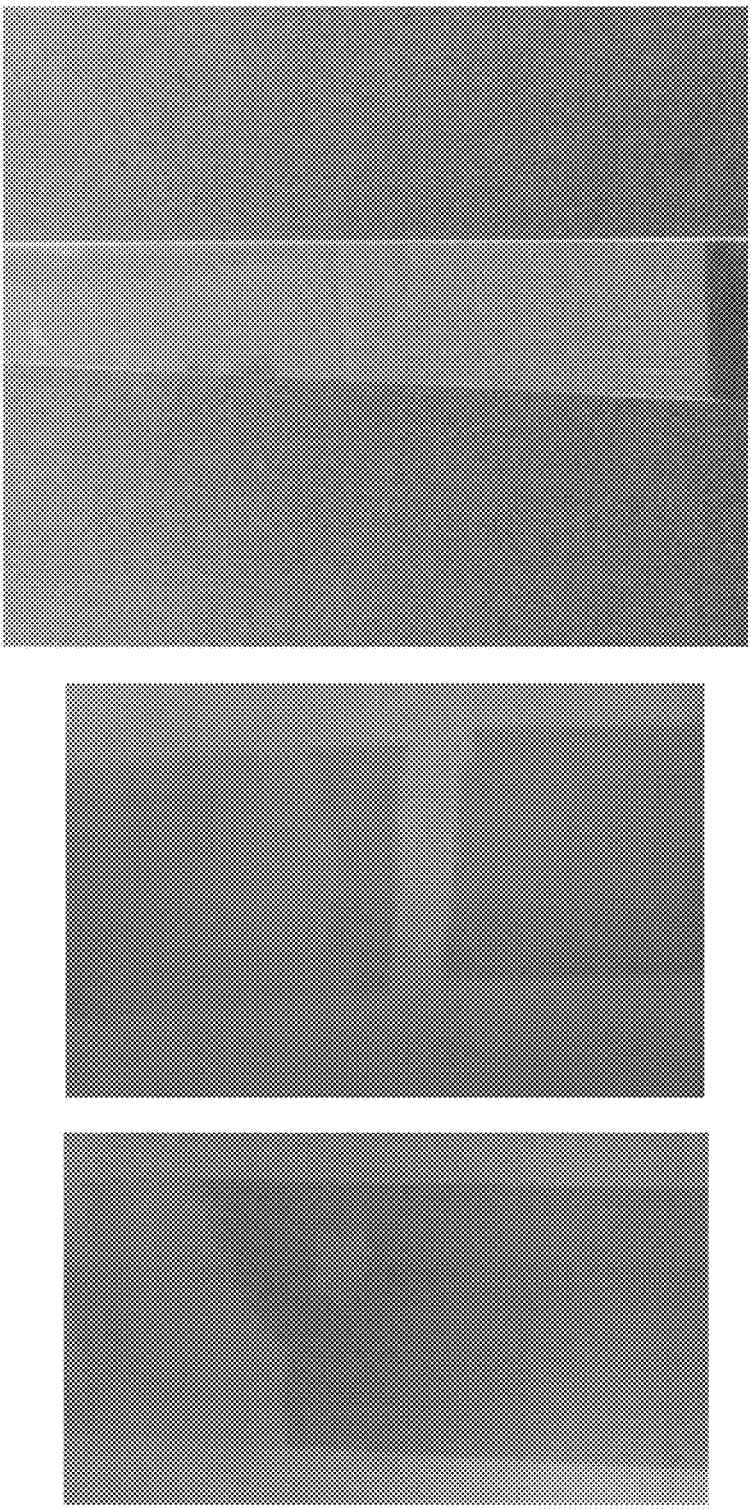
FIG. 2 is a schematic diagram explaining a state of a film after the bending test.

FIG. 2 is a schematic diagram for explaining a state of the film after the bending test. Even if the polyimide film of the present embodiment is bent 100,000 times as described above, it did not break and had no visible bending trace, as exemplarily shown in FIG. 2 (a). For example, the bent portion of the film after the bending test has a haze of preferably 5.0 or less, more preferably 3.0 or less, and even more preferably 1.0 or less. FIG. 2 (b) shows an example of a conventional polyimide film that broke when it was bent about 29,000 times. FIG. 2(c) shows an example of a PET film that had a visible bending trace after it was bent about 1,000 times.

Yellow Index (YI)

The yellow index (YI) of the polyimide film according to the present embodiment is preferably 5.0 or less, more preferably 4.5 or less, and still more preferably 4.0 or less. In this case, the film thickness of the polyimide film is preferably in the range of 0.1 μm to 30 μm, and more preferably in the range of 1 μm to 20 μm.

When a polyimide film is used for a film substrate for flexible devices, the polyimide film has a film thickness of preferably within the range of 1 μm to 10 μm and more preferably within the range of 1 μm to 5 μm from the viewpoint of improving bending resistance in accordance with thinning of a device.

A film having a thickness of less than 10 μm can be produced by, for example, stretching a polyimide film having a thickness of 10 μm or more. A surface of a support is coated with a polyimide varnish, and temporary drying is carried out until the polyimide film can provide a self-supportability even after the support is removed. As a support, the aforementioned PET film, polyimide films such as Kapton (registered trademark of Toray DuPont Co., Ltd.), Upilex (registered trademark of Ube Industries. Ltd.), etc., metal foil, etc., can be used. In the stretching treatment, the amount of the solvent remaining in the film containing a solvent is preferably 0.1 to 20% by weight from the viewpoint of the self-supportability and stretching processability of the film.

The temporarily dried film, which can be in a state being attached to a support or stripped from a support, can be stretched biaxially from 1.5 times to 5 times in the MD direction and/or TD direction while being heated to from 150° C. to 250° C. The stretching may be simultaneous biaxial stretching or sequential biaxial stretching, but simultaneous biaxial stretching is preferred from the viewpoint of reducing the film Rth. The temporarily dried film after stretching is then subjected to main drying and dried until the amount of the residual solvent becomes less than 0.1% by weight.

In the present embodiment, the yellow index (YI) can also be adjusted to 2.0 or less. As described, in the present embodiment, the yellow index can be suppressed low, i.e., a colorless and transparent polyimide film can be obtained. Note that "colorless and transparent" herein refers to a state in which the total light transmittance of a film is 80% or more, haze is 2 or less, and yellow index (YI) is 5.0 or less. Therefore, the polyimide film of the present embodiment can be suitably used for optical applications, such as touch panels and displays. For example, when the polyimide resin according to the present embodiment is used as a substrate film of a transparent electrode film, it does not adversely affect a color and brightness of a screen, even in the case where a touch panel element is attached on at least one of the top and lower surfaces of the substrate film and the surface of the substrate film or the opposite surface of the substrate film is used as a visually-recognized-surface.

Retardation (Rth)

The retardation (Rth) of the polyimide film of the present embodiment is a converted value for a film thickness of 15 μm, and it may be preferably 100 nm or less, more preferably 50 nm or less, and even more preferably 20 nm or less. Rth may be negative but is preferably a value larger than −5 nm.

For example, as described in Non-Patent Document 1, it is generally known that acid dianhydride and diamine skeleton used in general high heat-resistant polyimide resins have high planarity and aromatic ring density, and when a surface of a glass substrate is coated with the resin and dried, the polyimide chains are oriented toward a two-dimensional plane direction, which result in an anisotropy of reflective index between in-plane direction and out-of-plane direction, and an increased retardation (Rth). In general, known methods for reducing the anisotropy of refractive index include, for example, a method for suppressing the molecular orientation in the drying step by introducing a bending structure, and a method for diluting the concentration of an aromatic ring having a high electron density. Further, as described in Patent Document 4, a method for obtaining a colorless transparent film having a small anisotropy by using a polyimide with a bending group, such as 4,4'-diaminodiphenyl sulfone as diamine, is also known. However, in order to obtain a colorless and transparent film having a small refractive index anisotropy, a general method includes forming a polyimide film via a polyamic acid film prepared from a solution of a polyamic acid which is a precursor soluble in a solvent. In this case, since the polyamic acid film is inferior in strength and difficult to be a self-supporting film, which has caused a problem of deteriorating handleability.

In contrast, the polyimide film produced from the polyimide varnish of the present embodiment, in particular the polyimide varnish containing the polyimide represented by the above formula (1), has a low yellow index and a low retardation (Rth) and can be produced as a self-supporting film which is excellent in mechanical strength. For this reason, the polyimide film of the present embodiment can be used with sufficient handleability, for example, as optical device applications, such as touch panels and displays.

The retardation (Rth) converted for a film thickness of 15 μm is preferably 100 nm or less, since such a polyimide film less adversely affects rainbow unevenness of a screen even if the polyimide film of the present embodiment is used, for example, as a substrate film of a transparent electrode film, and even if a touch panel element is fabricated on at least one of the upper and lower surfaces of the substrate film that is to be a visually-recognized surface. While not wishing to be bound by any theory, the structure represented by formula (A-1) and formula (A-5) have a structure in which the $SO_2$ group is bending, and the bending structure is fixed due to the sp2 orbit thereof, and therefore it is assumed that the structure represented by formula (A-1) and the aromatic group contained in formula (A-5) do not align in one single direction but exist at random directions. Accordingly, when the structure represented by formula (A-1) and formula (A-5) are present in the polyimide skeleton, the difference in refractive index between the in-plane direction and the out-of-plane direction is small, and Rth can be reduced.

The polyimide film of the present embodiment can be used as an alternative to glass as is the case with a PET film and COP film. Furthermore, since the polyimide film of the present embodiment has an excellent bending resistance, it can be used as a foldable display or a display that follows a curved surface.

Polyimide Film Production Method

The polyimide film can be obtained, for example, by forming a film by coating, etc., a surface of a support with the varnish of the present embodiment, and then heating the varnish.

The method for producing a polyimide film in the present embodiment comprises, for example: coating a surface of a support with the varnish of the present embodiment, roughly drying the solvent to form a solvent-containing film (hereinafter also referred to as "intermediate film") containing 0.1% by weight to 20% by weight of solvent; and further heating the intermediate film and carrying out the main drying until the solvent is less than 0.1% by weight. A step of stretching the intermediate film may be carried out as appropriate.

Examples of a method for forming a film include publicly known coating methods, such as spin coating, slit coating, slot die coating, blade coating, etc.

Examples of a support include glass substrates, such as an alkali glass substrate, and non-alkali glass substrate (Eagle XG (registered trademark), manufactured by Corning Inc.); metal substrates, such as a copper substrate, aluminum substrate, SUS substrate, etc.; plastic films, such as colored polyimide films, such as a Upilex (registered trademark) film (manufactured by Ube Industries, Ltd.), Kapton (registered trademark) film (manufactured by Toray-DuPont Co., Ltd.), etc., polycarbonate film, PET film, etc.; metal foils, such as a copper foil, aluminum foil, SUS foil, etc. However, the heating and drying of the polyimide varnish can be carried out without a support, and the type of the support is not particularly limited. The substrate herein as a support refers to a material that is highly rigid and is not bendable, etc., and the film or film substrate herein refers to a material that is flexible and bendable to be processed.

The temperature in rough drying is generally 50° C. to 350° C., preferably 70° C. to 200° C., and more preferably 100° C. to 150° C.

The temperature in the main drying is generally 100° C. to 350° C., preferably 150° C. to 320° C., and more preferably 180° C. to 300° C.

The temperature in stretching is generally 200° C. to 400° C., preferably 200° C. to 350° C., and more preferably 250° C. to 350'° C. The temperature for drying after stretching is generally 200° C. to 400° C., preferably 200° C. to 350° C., and more preferably 250° C. to 350° C.

The polyimide film can be formed after removing a solvent by applying a temperature of 150° C. to 350° C. to the varnish in an inert gas atmosphere. The drying can also be carried out even in an air atmosphere, and is not particularly limited.

Examples of the varnish solvent (β) suitable for film formation include m-cresol, NMP, DMF, DMAc, GBL, DMSO, acetone, diethyl acetate, etc. Among these, using GBL as a solvent can unsure a low YI of a polyimide film.

As described above, the solvent is a host removed by heating and drying the polyimide varnish. From the viewpoint of obtaining desired YI, Rth, and bending resistance without impairing desired physical properties, the content of a solvent, for example, GBL, in the polyimide film is preferably less than 3% by weight, more preferably less than 1% by weight, and even more preferably 0.5% by weight or less. It is noted that GBL may be contained in the polyimide film as a residual amount of at least about 0.01% by weight.

The method for producing the polyimide film of the present embodiment includes: a method for forming a polyimide film from the polyimide varnish of the present embodiment in which polyimide is imidized in advance; and a method for forming a polyimide film from the polyimide precursor varnish of the present embodiment.

In the case of the method for forming a polyimide film from a polyimide varnish, the solubility of the polyimide in the solvent is favorable, and the polyimide film is capable of being a film having supportability (self-supporting film) even if the polyimide varnish is coated on a surface of a support and is temporarily dried followed by removal of the support. Therefore, a polyimide film having a solvent content of less than 0.1% by weight and a low orientation of the polymer can be obtained by heating a polyimide film (in the present description, also referred to as "temporarily dried film", "intermediate film" and "solvent-containing film") containing 0.1% by weight to 20% by weight of a solvent after temporary drying, in a free state in which the film is not being supported by the support. Further, the temporarily dried film may be stretched and heated in a free state of not being supported by the support.

In the case of the method of heating a polyimide precursor for imidization in a state that a surface of a support is coated with a varnish containing the polyimide precursor, the residual stress of the polyimide film tends to increase due to strain generated from a difference in expansion with the support. Moreover, when imidizing a polyamic acid film which is a polyimide precursor, polyamic acid films are inferior in strength, and therefore a support is needed, which makes it difficult to obtain a self-supporting film after temporary drying. Furthermore, since distortion of the polyimide film may occur due to dehydration shrinkage, the residual distortion thereof tends to increase. For this reason, when forming a polyimide film from the varnish containing a polyimide precursor, it is preferred to coat the varnish on a surface of a heat-resistant support, such as a colored polyimide film, etc.

The polyimide film in the present embodiment has an excellent bending resistance due to higher elongation at break and strength at break.

In another embodiment, a functional layer may be formed on a surface of the polyimide film to form a laminate. The functional layer can be obtained, for example, by forming a transparent electrode layer on the surface of the polyimide film using a sputtering apparatus. When the laminate has polyimide films on both sides, the transparent electrode layer may be formed on both sides of the laminate. It is preferable to form at least one transparent electrode layer on each surface of the polyimide films on both sides of the laminate. Moreover, between the transparent electrode layer and the polyimide film may comprise other layers, such as an undercoat layer for imparting smoothness, a hard coat layer for imparting surface hardness, an index matching layer for improving visibility, a gas barrier layer for imparting a gas barrier property. The hard coat layer for imparting surface hardness and index matching layer for improving visibility may be laminated on the transparent electrode layer and the polyimide film. The laminate is particularly suitable for use in touch panel materials, such as transparent electrode films.

Flexible Display Device

The flexible display device of the present embodiment has the polyimide layer of the present embodiment. Examples of the flexible display device include organic EL displays, such as a bottom emission type flexible organic EL display, top emission type flexible organic EL display, etc.; or a flexible liquid crystal display.

The varnish and polyimide film of the present embodiment are suitable for forming a polyimide layer used in a flexible display device. The flexible display device can be preferably manufactured using the varnish or the polyimide film of the present embodiment. The flexible display device of the present embodiment may have a polyimide film as at least one layer of a base film used for the display unit. The polyimide film of the present embodiment may be, for example, a polyimide film formed on a surface of a support, or a supportable film (self-supporting film) without a support. The polyimide film is preferably a self-supporting film from the viewpoint of being made in the form of a roll film that is applied to a film processing. The polyimide film of the present embodiment can be used as a substitute to glass as is the case with a PET film or a COP film and can also be used for a foldable display or a display that follows a curved surface.

When the polyimide film is used for a film substrate for a flexible display device, the film thickness thereof is preferably in the range of 1 μm to 50 μm, and more preferably in the range of 1 μm to 25 μm, from the viewpoint of thinning the device and improving the bending resistance.

When the polyimide film of the present embodiment is used for a flexible display device, it is preferred that the flexible display device comprises a light source, and the device is configured such that a light from the light source passes through the polyimide film of the present embodiment and is output to the outside of the flexible display device.

Laminate

In the present embodiment, a laminate can be produced by forming a transparent electrode layer on a surface of the polyimide film.

The laminate can be obtained by forming a transparent electrode layer on a surface of the polyimide film using a sputtering apparatus, etc. The polyimide film may have a support or may be a single layer without a support. The laminate may have transparent electrode layers on both sides of the polyimide film. In this case, it is preferred to have at least one transparent electrode layer on each side of the both surfaces of the polyimide film. Further, between the transparent electrode layer and the polyimide film may comprise other layers, such as an undercoat layer for imparting smoothness, hard coat layer for imparting surface hardness, index matching layer for improving visibility, gas barrier layer for imparting a gas barrier property, etc. The hard coat layer for imparting surface hardness and the index matching layer for improving visibility may be laminated on the transparent electrode layer and the polyimide film. The laminate of the present embodiment is suitable for use in touch panel materials, such as transparent electrode films.

In the case of forming a transparent electrode film, the film-forming step of the transparent electrode layer on the polyimide film surface is carried out in a low temperature range of, for example, 80 to 100° C. In order to actually exhibit the desired performance, it is preferable to carry out sputtering at an elevated temperature to form a transparent electrode layer having a low specific resistance. The transparent electrode layer can be configured so as to be formed on both surfaces of the polyimide film. Due to this configuration, for example, touch panel elements can be disposed on the both sides.

In this case, when the temperature at which the transparent electrode layer is formed is higher compared with the glass transition temperature (Tg) of the polyimide film constituting the film formation surface, problems, such as shrinkage, breakage, etc., of the polyimide film, may occur in the elevated temperature region. Generally, when a transparent electrode layer is formed on a PET film, sputtering is carried out at a temperature lower than about 100° C. that is the glass transition temperature (Tg) of the PET film, such as about 80° C. On the other hand, the polyimide film according to the present embodiment has a high glass transition temperature (Tg) of about 250° C. or higher (on the basis of a film thickness of 15 μm) and is excellent in heat resistance. Accordingly, even under an elevated temperature of 200° C. or higher, a high bending resistance can be maintained. Therefore, a transparent electrode layer having a low specific resistance can be formed by subjecting a surface of the polyimide film 10 of the present embodiment to sputtering, for example, at about 150 to 250° C.

Moreover, in the present embodiment, from the viewpoint of improving the yield when forming the transparent electrode layer 21, the polyimide preferably has a strength at break of 100 MPa or more on the basis of the polyimide film thickness of 15 μm.

Further, from the viewpoint of improving performances of a transparent electrode film, the polyimide film according to the present embodiment preferably has a glass transition temperature (Tg) of 250° C. or higher based on the film thickness of 15 μm as described above.

EXAMPLES

Hereinafter, the present invention will be described in more detail based on the Examples, but they are described for the purpose of explanation, and the scope of the present invention is not limited to the Examples below. Various evaluations in the Examples were carried out as follows.
Measurement and Evaluation Method
Evaluation of Bending Resistance (Bending Test)

The bending resistance of the polyimide film was evaluated by adjusting humidity of a film at relative humidity of 50% at 25° C. for 24 hours and carrying out repeated bending test that was reciprocated 100,000 times in a state that a test piece having a width of 15 mm, a length of 100 mm and a thickness of 7 to 20 μm was loaded with a weight of 0.625 kg/mm$^2$, under the conditions of a bending radius R of 2 mm, a bending angle of 135°, and a rate of 90 times/minute, using a MIT type repeated bending tester (MIT-DA, manufactured by Toyo Seiki Seisaku-sho, Ltd.). After the test, the sample was removed from the apparatus, and the bending resistance evaluation result was obtained.

The obtained bending resistance was ranked according to the following criteria. Rank of Bending Resistance
 G (Good): No bending trace can be confirmed visually.
 P (Poor): Bending trace can be confirmed visually, or haze is 5.0 or more.

It is noted that the haze was measured using a D65 light source with a spectrocolorimeter (CM3600A) manufactured by Konica Minolta, Inc.
Transmittance Measurement The transmittance of the polyimide varnish was measured by adjusting a solid content concentration of the polyimide varnish to 20% by weight and then measuring the LV-visible absorption spectrum under the following conditions. The apparatus used was a UV/VIS SPECTROPHOMETER (V-550, manufactured by JASCO Corporation). The background was measured by placing cells filled with the same solvent as that of the varnish in the reference chamber and in the sample chamber. The transmittance spectrum was measured by placing a cell filled with the same solvent as that of the varnish in the reference chamber and placing a cell filled with the measurement sample in the sample chamber. From the obtained spectrum data, the value obtained at an optical path length of 10 mm and at a wavelength of 450 nm was defined as transmittance.
 Apparatus: UV/VIS SPECTROPHOTOMETER (V-550, manufactured by JASCO Corporation)
 Cell size: 10 mm thickness×10 mm width×400 mm height
 Measurement wavelength: 300 nm to 800 nm
 Band width: 2.0 nm
 Scanning speed: 200 nm/minute The obtained transmittance was ranked according to the following criteria.
Transparency Rank
 VG (Very good): Transmittance exceeds 60%.
 G (Good): Transmittance is 45% or more and 60% or less.
 P (Poor): Transmittance is less than 45%.
Measurement of Contents of Metal Element, Phosphorus, and Silicon The contents of metal elements, phosphorus and silicon in the varnish were measured by ICP-AES measurement. 0.5 g of the raw material was weighed, a sample after wet decomposition with nitric acid, then nitric acid plus hydrochloric acid, and then nitric acid plus perchloric acid, was made up to 25 mL, and ICP-AES qualitative analysis was carried out.
Measurements of Weight-Average Molecular Weight (Mw) and Number-Average Molecular Weight (Mn) The weight-average molecular weight (Mw) and the number-average molecular weight (Mn) were measured by gel permeation chromatography (GPC) under the following conditions. As a solvent, N, N-dimethylformamide (for high performance liquid chromatograph, manufactured by Wako Pure Chemical Industries, Ltd.) in which 24.8 mol/L of lithium bromide monohydrate (purity 99.5%, manufactured by Wako Pure Chemical Industries, Ltd.) and 63.2 mol/L of phosphoric acid (for high performance liquid chromatograph, manufactured by Wako Pure Chemical Industries, Ltd.) were added before the measurement, was used. Moreover, a calibration curve for calculating the weight-average molecular weight was prepared using standard polystyrenes (manufactured by Tosoh Corporation).
 Column: TSK-GEL SUPER HM-H×2
 Flow rate: 0.5 mL/minute
 Column temperature: 40° C.
 Pump: PU-2080 (manufactured by JASCO Corporation)
 Detector: RI-2031 Plus (RI: differential refractometer, manufactured by JASCO Corporation)
 UV-2075 Plus (UV-Vis: UV-Visible Absorber, manufactured by JASCO Corporation)
Evaluation of Surface Smoothness (Ra)

Using a nanoscale hybrid microscope (VN8000, manufactured by Keyence Corporation), the measurement area (50 μm×50 μm) on the film layer side of the laminate was scanned, and an arithmetically averaged roughness (Ra) of the surface was measured.
Evaluation of Yellow Index (YI)

The yellow index (YI value) of the polyimide film was measured using a D65 light source with a spectrocolorimeter (CM3600A) manufactured by Konica Minolta. Inc. Here, unless otherwise specified, measurement was carried out on a film having a thickness of 20±1 μm as a sample.

The obtained yellow index (YI) was ranked according to the following criteria. YI Rank
 VG (Very good): YI of the film is 2 or less.
 G (Good): YI is greater than 2 and 4 or less.
 P (Poor): YI exceeds 4.

Subsequently, the conditions for synthesizing the polyimide and the conditions for fabricating the polyimide film will be specifically described.

Abbreviations of Acid Dianhydrides and Diamines

Acid Dianhydrides
6FDA: 4,4'-(hexafluoroisopropylidene)diphthalic dianhydride
ODPA: 4,4'-oxydiphthalic dianhydride PMDA: 4, pyromellitic dianhydride
BPDA: 3,3',4,4'-biphenyltetracarboxylic dianhydride
HPMDA: Hydroxypyromellitic dianhydride
TDA: 1,3,3a,4,5,9b-hexahydro-5-(tetrahydro-2,5-dioxo-3-furanyl)naphtho[1,2-c]furan-1,3-dione
BODA: Bicyclo[2,2,2]oct-7-ene-2,3,5,6-tetracarboxylic dianhydride (also referred to as BCDA)
Diamines
TFMB: 2,2'-bis(trifluoromethyl)benzidine
3,3'-DDS: 3,3'-diaminodiphenyl sulfone
4,4'-DDS: 4,4'-diaminodiphenyl sulfone
CHDA: Cyclohexyldiamine
14BAC: 1,4-bis(aminomethyl)cyclohexane
BANBDA: Bis(aminomethyl)norbornane
BAPB: 4,4'-bis(4-aminophenoxybiphenyl)
BAPDB: α,α'-bis(4-aminophenyl)-1,4-diisopropylbenzene
Synthesis Example of Polyimide Varnish A polyimide varnish and a polyimide precursor (polyamide acid) varnish were prepared as shown in the following synthesis examples and comparative synthesis examples. The amounts (mol %) of the raw acid dianhydrides and diamines are shown in Table 1. The trace metal was added to the reaction solution together with the raw materials to prepare each Example and Comparative Example. Table 2 shows the types and amounts of the added metals.

Synthesis Example 1-1

While introducing a nitrogen gas into a 500 mL separable flask with a stirring bar, equipped with a Dean-Stark tube and a reflux tube at the top, 22.19 g (69.30 mmol) of 2,2'-bis(trifluoromethyl)benzidine (TFMB), and 50.00 g of γ-butyrolactone (GBL) were added. Subsequently, 31.09 g (70.00 mmol) of 4,4'-(hexafluoroisopropylidene)diphthalic dianhydride (6FDA) and 22.28 g of GBL were added at room temperature. The solution was stirred at room temperature for 6 hours to prepare a polyimide precursor, 26.02 g of toluene was added at room temperature, and then the temperature was raised to an internal temperature of 160° C. followed by heating to reflux at 160° C. for 1 hour to allow imidization to proceed. After completion of imidization, the temperature was raised to 180° C., and the reaction was continued while extracting toluene. After the reaction for 12 hours, the oil bath was removed, the temperature was returned to room temperature, and GBL was added so that a solid content was 20% concentration by weight to obtain a polyimide GBL solution (hereinafter also referred to as polyimide varnish).

Synthesis Example 1-2

A polyimide varnish was synthesized in the same manner as in Synthesis Example 1-1 with the exception of changing the addition of the metal as shown in Table 2.

Synthesis Example 1-3

A polyimide precursor varnish was synthesized in the same manner as in Synthesis Example 1-1 with the exception of changing the addition of the metal as shown in Table 2, setting the reaction temperature to 80° C., and not carrying out imidization by the heating and reflux step.

Synthesis Example 2-1

A polyimide varnish was synthesized in the same manner as in Synthesis Example 1-1 with the exception of changing the charge of the acid dianhydride and diamine and the addition of the metal as shown in Tables 1 and 2.

Synthesis Example 2-2

A polyimide varnish was synthesized in the same manner as in Synthesis Example 1-1 with the exception of changing the charge of the acid dianhydride and diamine and the addition of the metal as shown in Tables 1 and 2.

Synthesis Example 3-1

A polyimide varnish was synthesized in the same manner as in Synthesis Example 1-1 with the exception of changing the charge of the acid dianhydride and diamine and the addition of the metal as shown in Tables 1 and 2 and using N-methylpyrrolidone (NMP) as the solvent.

Synthesis Example 3-2

A polyimide varnish was synthesized in the same manner as in Synthesis Example 1-1 with the exception of changing the charge of the acid dianhydride and diamine and the addition of the metal as shown in Tables 1 and 2 and using N-methylpyrrolidone (NMP) as the solvent.

Synthesis Example 4-1

A polyimide varnish was synthesized in the manner described below by changing the charge of acid dianhydride and diamine and the addition of the metal as shown in Tables 1 and 2. While introducing a nitrogen gas into a 500 mL separable flask with a stirring bar, equipped with a Dean-Stark tube and a reflux tube at the top, to 12.05 g (48.51 mmol) of 4,4'-DDS, 5.16 g (20.79 mmol) of 3,3'-DDS and 50.00 g of GBL were added. Subsequently, 21.71 g (70.00 mmol) of 4,4'-oxydiphthalic dianhydride (ODPA), 22.28 g of GBL and 26.02 g of toluene were added at room temperature. Then the temperature was raised to an internal temperature of 160° C. followed by heating to reflux at 160° C. for 1 hour to allow imidization to proceed. After completion of imidization, the temperature was raised to 180° C., and the reaction was continued while extracting toluene. After the reaction for 12 hours, the oil bath was removed, the temperature was returned to room temperature, and GBL was added so that a solid content was 20% concentration by weight to obtain a polyimide GBL solution (hereinafter also referred to as polyimide varnish).

Synthesis Example 4-2

A polyimide varnish was synthesized in the same manner as in Synthesis Example 4-1 with the exception of changing the charge of the acid dianhydride and diamine and the addition of the metal as shown in Tables 1 and 2.

Synthesis Example 5-1

A polyimide varnish was synthesized in the same manner as in Synthesis Example 4-1 with the exception of changing the charge of the acid dianhydride and diamine and the addition of the metal as shown in Tables 1 and 2 and setting the reaction time to 7 hours.

Synthesis Example 5-2

A polyimide varnish was synthesized in the same manner as in Synthesis Example 4-1 with the exception of changing the charge of the acid dianhydride and diamine and the addition of the metal as shown in Tables 1 and 2 and setting the reaction time to 7 hours.

Synthesis Example 6

A polyimide varnish was synthesized in the same manner as in Synthesis Example 4-1 with the exception of changing the charge of the acid dianhydride and diamine and the addition of the metal as shown in Tables 1 and 2 and setting the reaction time to 7 hours.

Synthesis Example 7

A polyimide varnish was synthesized in the same manner as in Synthesis Example 4-1 with the exception of changing the charge of the acid dianhydride and diamine and the addition of the metal as shown in Tables 1 and 2 and setting the reaction time to 7 hours.

Synthesis Example 8

A polyimide varnish was synthesized in the same manner as in Synthesis Example 4-1 with the exception of changing the charge of the acid dianhydride and diamine and the addition of the metal as shown in Tables 1 and 2, using NMP as the solvent and setting the reaction time to 7 hours.

Synthesis Example 9

A polyimide varnish was synthesized in the same manner as in Synthesis Example 4-1 with the exception of changing the charge of the acid dianhydride and diamine and the addition of the metal as shown in Tables 1 and 2, using NMP as the solvent and setting the reaction time to 7 hours.

Synthesis Example 10

A polyimide varnish was synthesized in the same manner as in Synthesis Example 4-1 with the exception of changing the charge of the acid dianhydride and diamine and the addition of the metal as shown in Tables 1 and 2 and setting the reaction time to 7 hours.

Synthesis Example 11

A polyimide varnish was synthesized in the same manner as in Synthesis Example 4-1 with the exception of changing the charge of the acid dianhydride and diamine and the addition of the metal as shown in Tables 1 and 2 and setting the reaction time to 7 hours.

Synthesis Example 12

A polyimide varnish was synthesized in the same manner as in Synthesis Example 4-1 with the exception of changing the charge of the acid dianhydride and diamine and the addition of the metal as shown in Tables 1 and 2 and setting the reaction time to 7 hours.

Synthesis Example 13

A polyimide varnish was synthesized in the same manner as in Synthesis Example 4-1 with the exception of changing the charge of the acid dianhydride and diamine and the addition of the metal as shown in Tables 1 and 2 and setting the reaction time to 3 hours.

Synthesis Example 14

A polyimide varnish was synthesized in the same manner as in Synthesis Example 4-1 with the exception of changing the charge of the acid dianhydride and diamine and the addition of the metal as shown in Tables 1 and 2 and setting the reaction time to 4 hours.

Synthesis Example 15

A polyimide varnish was synthesized in the same manner as in Synthesis Example 4-1 with the exception of changing the charge of the acid dianhydride and diamine and the addition of the metal as shown in Tables 1 and 2 and setting the reaction time to 6 hours.

Synthesis Example 16

While introducing a nitrogen gas into a 500 mL separable flask with a stirring bar, equipped with a Dean-Stark tube and a reflux tube at the top, to 5.11 g (13.86 mmol) of 4,4'-bis(4-aminophenoxybiphenyl) (BAPB), 10.32 g (41.58 mmol) of 3,3'-DDS, 3.44 g (13.86 mmol) of 4,4'-DDS, and 50.00 g of GBL were added. Subsequently, 21.71 g (70.00 mmol) of 4,4'-oxydiphthalic dianhydride (ODPA), 22.28 g of GBL and 25.63 g of toluene were added at room temperature. Then the temperature was raised to an internal temperature of 160° C. followed by heating to reflux at 160° C. for 1 hour to allow imidization to proceed. After completion of imidization, the temperature was raised to 180° C., and the reaction was continued while extracting toluene. After the reaction for 6 hours, the oil bath was removed, the temperature was returned to room temperature, and NMP was added so that a solid content was 20% concentration by weight to obtain a polyimide NMP solution (hereinafter also referred to as polyimide varnish).

Synthesis Example 17

A polyimide varnish was synthesized in the same manner as in Synthesis Example 4-1 with the exception of changing the charge of the acid dianhydride and diamine and the addition of the metal as shown in Tables 1 and 2 and setting the reaction time to 6 hours.

Synthesis Example 18

A polyimide varnish was synthesized in the same manner as in Synthesis Example 4-1 with the exception of changing the charge of the acid dianhydride and diamine and the addition of the metal as shown in Tables 1 and 2.

Synthesis Example 19

A polyimide varnish was synthesized in the same manner as in Synthesis Example 4-1 with the exception of changing the charge of the acid dianhydride and diamine and the addition of the metal as shown in Tables 1 and 2.

Synthesis Example 201

A polyimide varnish was synthesized in the same manner as in Synthesis Example 4-1 with the exception of changing the charge of the acid dianhydride and diamine and the addition of the metal as shown in Tables 1 and 2.

Comparative Synthesis Example 1

All the raw materials were purified. The metal ion concentrations of the raw materials were measured, the concentrations of Cu, Cr, Zr, Zn, Mn, Co, Pd, Ni, Rh, Al, and Fe were all 0.01 ppm or less, and the concentrations of silicon and phosphorus were similarly 0.01 ppm or less.

Using the purified raw materials, a polyimide varnish was synthesized in the same manner as in Synthesis Example 1-1 with the exception of changing the charge of the acid dianhydride and diamine and the addition of the metal as shown in Tables 1 and 2.

Comparative Synthesis Example 2

Using the purified raw materials, a polyimide varnish was synthesized in the same manner as in Synthesis Example 1-1 with the exception of changing the charge of the acid dianhydride and diamine and the addition of the metal as shown in Tables 1 and 2 and using N-methylpyrrolidone (NMP) as the solvent.

Comparative Synthesis Example 3

Using the purified raw materials, a polyimide varnish was synthesized in the same manner as in Synthesis Example 4-1 with the exception of changing the charge of the acid dianhydride and diamine and the addition of the metal as shown in Tables 1 and 2.

Comparative Synthesis Example 4

Using the purified raw materials, a polyimide varnish was synthesized in the same manner as in Synthesis Example 4-1 with the exception of changing the charge of the acid dianhydride and diamine and the addition of the metal as shown in Tables 1 and 2 and setting the reaction time to 7 hours.

Comparative Synthesis Example 5

Using the purified raw materials, a polyimide varnish was synthesized in the same manner as in Synthesis Example 4-1 with the exception of changing the charge of the acid dianhydride and diamine and the addition of the metal as shown in Tables 1 and 2.

Comparative Synthesis Example 6

Using the purified raw materials, a polyimide varnish was synthesized in the same manner as in Synthesis Example 4-1 with the exception of changing the charge of acid dianhydride and diamine and the addition of the metal as shown in Tables 1 and 2.

Comparative Synthesis Example 7

Using the purified raw materials, a polyimide varnish was synthesized in the same manner as in Synthesis Example 4-1 with the exception of changing the charge of the acid dianhydride and diamine and the addition of the metal as shown in Tables 1 and 2.

The compositions of the polyimide varnishes obtained in Synthesis Examples 1-1 to 20 and Comparative Synthesis Examples 1 to 7, and the evaluation results thereof are shown in the following tables.

TABLE 1

| | | Acid dihydrates (mol %) | | | | | | | Diamines (mol %) | |
|---|---|---|---|---|---|---|---|---|---|---|
| | No. | 6FDA % | ODPA % | PMDA % | BPDA % | HPMDA % | TDA % | BODA % | TFMB % | 3,3'-DDS % |
| Synthesis examples | 1-1 | 100 | | | | | | | 100 | |
| | 1-2 | 100 | | | | | | | 100 | |
| | 1-3 | 100 | | | | | | | 100 | |
| | 2-1 | | 100 | | | | | | 100 | |
| | 2-2 | | 100 | | | | | | 100 | |
| | 3-1 | | 100 | | | | | | | 20 |
| | 3-2 | | 100 | | | | | | | 20 |
| | 4-1 | | 100 | | | | | | | 30 |
| | 4-2 | | 100 | | | | | | | 30 |
| | 5-1 | | 100 | | | | | | | 40 |
| | 5-2 | | 100 | | | | | | | 40 |
| | 6 | | 80 | | | 20 | | | | 50 |
| | 7 | | 80 | | | 20 | | | | 60 |
| | 8 | | | 100 | | | | | | 50 |
| | 9 | | | | | 100 | | | | 50 |
| | 10 | 100 | | | | | | | | 50 |
| | 11 | 100 | | | | | | | | 20 |
| | 12 | 100 | | | | | | | | 60 |
| | 13 | | 100 | | | | | | | 60 |
| | 14 | | 100 | | | | | | | 60 |
| | 15 | | 100 | | | | | | | 60 |
| | 16 | | 100 | | | | | | | 60 |
| | 17 | | 100 | | | | | | | 60 |
| | 18 | | 50 | | | 50 | | | | 50 |
| | 19 | | 80 | | | | 20 | | | 50 |
| | 20 | | 80 | | | | | 20 | | 50 |
| Comparative synthesis examples | 1 | 100 | | | | | | | 100 | |
| | 2 | | 100 | | | | | | | 20 |
| | 3 | | 100 | | | | | | | 40 |
| | 4 | | 100 | | | | | | | 40 |
| | 5 | | 100 | | | | | | | 40 |
| | 6 | | 100 | | | | | | | 40 |
| | 7 | | 100 | | | | | | | 40 |

TABLE 1-continued

| | No. | 4,4'-DDS % | CHDA % | 14BAC % | BANBDA % | BAPB % | BAPDB % | b/a ratio | Solvent |
|---|---|---|---|---|---|---|---|---|---|
| Synthesis examples | 1-1 | | | | | | | 0.99 | GBL |
| | 1-2 | | | | | | | 0.95 | GBL |
| | 1-3 | | | | | | | 0.95 | GBL |
| | 2-1 | | | | | | | 0.99 | GBL |
| | 2-2 | | | | | | | 0.95 | GBL |
| | 3-1 | 80 | | | | | | 0.99 | NMP |
| | 3-2 | 80 | | | | | | 0.95 | NMP |
| | 4-1 | 70 | | | | | | 0.99 | GBL |
| | 4-2 | 70 | | | | | | 0.96 | GBL |
| | 5-1 | 60 | | | | | | 0.99 | GBL |
| | 5-2 | 60 | | | | | | 0.97 | GBL |
| | 6 | 50 | | | | | | 0.99 | GBL |
| | 7 | 40 | | | | | | 0.99 | GBL |
| | 8 | 50 | | | | | | 0.99 | NMP |
| | 9 | 50 | | | | | | 0.99 | NMP |
| | 10 | 50 | | | | | | 0.99 | GBL |
| | 11 | 80 | | | | | | 0.99 | GBL |
| | 12 | 40 | | | | | | 0.99 | GBL |
| | 13 | 20 | 20 | | | | | 0.99 | GBL |
| | 14 | 20 | | 20 | | | | 0.99 | GBL |
| | 15 | 20 | | | 20 | | | 0.99 | GBL |
| | 16 | 20 | | | | 20 | | 0.99 | GBL/NMP |
| | 17 | 20 | | | | | 20 | 0.99 | GBL |
| | 18 | 50 | | | | | | 0.99 | GBL |
| | 19 | 50 | | | | | | 0.99 | GBL |
| | 20 | 50 | | | | | | 0.99 | GBL |
| Comparative synthesis examples | 1 | | | | | | | 1.01 | GBL |
| | 2 | 80 | | | | | | 1.01 | NMP |
| | 3 | 60 | | | | | | 1.01 | GBL |
| | 4 | 60 | | | | | | 0.94 | GBL |
| | 5 | 60 | | | | | | 0.99 | GBL |
| | 6 | 60 | | | | | | 0.99 | GBL |
| | 7 | 60 | | | | | | 0.99 | GBL |

Fabrication of Polymide Film

Examples 1 to 261

A surface of Upilex (product number: Upilex125s, manufactured by Ube Industries, Ltd.) as a supporting base material was coated with a coating thickness of 150 μm using the polyimide varnish or polyimide precursor varnish in each Synthesis Example as shown in Tables 2 and 3, and the varnish was dried at 50° C. for 30 minutes. Table 3 below shows each test result of the self-supporting film of polyimide in a state where the laminate of the solvent-containing film and the Upilex film was dried at 270° C. for 1 hour and then the Upilex film as the support was stripped off.

Comparative Examples 1-7

The surface of Upilex (product number: Upilex125s, manufactured by Ube Industries, Ltd.) as a supporting base material was coated with a coating thickness of 150 μm using the polyimide varnish in each Comparative Synthesis Example as shown in Tables 2 and 3 and the varnish was dried at 50° C. for 30 minutes. Table 3 below shows each test result of the self-supporting film of polyimide in a state where the laminate of the solvent-containing film and the Upilex film was dried at 270° C. for 1 hour and then the Upilex film as the support was stripped off.

[Evaluation Results]

As shown in Table 3, the polyimide films of the present embodiment are excellent in bending resistance, surface smoothness, and transparency (YI value).

TABLE 2

| | | Polymer | Contents of metal element (ppm) | | | | | | |
|---|---|---|---|---|---|---|---|---|---|
| | No. | synthesis No. | Zn | Zr | Cu | Cr | Mn | Co | Pd |
| Examples | 1 | Synthesis example 1-1 | 300 | 1.3 | 6.8 | 0.3 | 0.1 | 0.05 | 0.01 or less |
| | 2 | Synthesis example 1-2 | 1.0 | 1.3 | 300 | 0.3 | 0.1 | 0.05 | 0.01 or less |
| | 3 | Synthesis example 2-1 | 0.9 | 0.6 | 100 | 0.1 | 0.1 | 0.01 or less | 0.01 or less |
| | 4 | Synthesis example 2-2 | 0.9 | 0.6 | 50 | 0.1 | 0.1 | 0.01 or less | 0.01 or less |

TABLE 2-continued

|  | No. | Name | | | | | | | |
|---|---|---|---|---|---|---|---|---|---|
|  | 5 | Synthesis example 3-1 | 1.2 | 2.1 | 13 | 0.2 | 0.1 | 0.01 or less | 0.01 or less |
|  | 6 | Synthesis example 3-2 | 1.2 | 2.1 | 13 | 0.2 | 0.1 | 0.01 or less | 0.01 or less |
|  | 7 | Synthesis example 4-1 | 1.2 | 1.9 | 12 | 0.2 | 0.1 | 0.01 or less | 0.01 or less |
|  | 8 | Synthesis example 4-2 | 1.2 | 1.9 | 12 | 0.2 | 0.1 | 0.01 or less | 0.01 or less |
|  | 9 | Synthesis example 5-1 | 1.1 | 1.8 | 10 | 100 | 0.1 | 0.01 or less | 0.01 or less |
|  | 10 | Synthesis example 5-2 | 1.1 | 100 | 10 | 0.2 | 0.1 | 0.01 or less | 0.01 or less |
|  | 11 | Synthesis example 6 | 1.1 | 1.7 | 8.5 | 0.2 | 0.1 | 0.01 or less | 200 |
|  | 12 | Synthesis example 7 | 1.1 | 1.6 | 8.5 | 0.3 | 0.1 | 0.01 or less | 0.01 or less |
|  | 13 | Synthesis example 8 | 50 | 0.06 | 50 | 0.3 | 0.1 | 0.01 or less | 0.01 or less |
|  | 14 | Synthesis example 9 | 50 | 2.1 | 50 | 0.3 | 0.1 | 0.01 or less | 0.01 or less |
|  | 15 | Synthesis example 10 | 1.1 | 1.8 | 12 | 0.3 | 100 | 0.05 | 0.01 or less |
|  | 16 | Synthesis example 11 | 1.1 | 1.6 | 12 | 0.2 | 0.1 | 100 | 0.01 or less |
|  | 17 | Synthesis example 12 | 1.1 | 1.2 | 50 | 0.3 | 0.1 | 0.05 | 0.01 or less |
|  | 18 | Synthesis example 13 | 0.9 | 1.4 | 14 | 0.3 | 0.1 | 0.01 or less | 0.01 or less |
|  | 19 | Synthesis example 14 | 0.9 | 1.4 | 13 | 0.3 | 0.1 | 10 | 0.01 or less |
|  | 20 | Synthesis example 15 | 1.0 | 1.4 | 12 | 0.3 | 0.1 | 10 | 50 |
|  | 21 | Synthesis example 16 | 1.0 | 1.4 | 20 | 0.3 | 0.1 | 0.01 or less | 0.01 or less |
|  | 22 | Synthesis example 17 | 1.0 | 1.4 | 20 | 0.4 | 0.1 | 0.01 or less | 0.01 or less |
|  | 23 | Synthesis example 18 | 0.9 | 0.06 | 13 | 0.05 | 0.1 | 0.01 or less | 0.01 or less |
|  | 24 | Synthesis example 19 | 1.1 | 1.5 | 4.5 | 0.09 | 0.1 | 0.01 or less | 0.01 or less |
|  | 25 | Synthesis example 20 | 10 | 1.7 | 5.5 | 0.1 | 0.1 | 0.01 or less | 0.01 or less |
|  | 26 | Synthesis example 1-3 | 100 | 1.3 | 100 | 0.3 | 0.1 | 0.05 | 0.01 or less |
| Comparative Examples | 1 | Comparative synthesis example 1 | 0.01 or less | 0.01 or less | 0.01 or less | 0.01 or less | 0.01 or less | 0.01 or less | 0.01 or less |
|  | 2 | Comparative synthesis example 2 | 0.01 or less | 0.01 or less | 0.01 or less | 0.01 or less | 0.01 or less | 0.01 or less | 0.01 or less |
|  | 3 | Comparative synthesis example 3 | 0.01 or less | 0.01 or less | 0.01 or less | 0.01 or less | 0.01 or less | 0.01 or less | 0.01 or less |
|  | 4 | Comparative synthesis example 4 | 0.01 or less | 0.01 or less | 0.01 or less | 0.01 or less | 0.01 or less | 0.01 or less | 0.01 or less |
|  | 5 | Comparative synthesis example 5 | 600 | 0.01 or less | 600 | 0.01 or less | 0.01 or less | 0.01 or less | 0.01 or less |
|  | 6 | Comparative synthesis example 6 | 0.01 or less | 0.01 or less | 0.01 or less | 0 01 or less | 600 | 0.01 or less | 600 |
|  | 7 | Comparative synthesis example 7 | 0.01 or less | 0.01 or less | 800 | 0.01 or less | 0.01 or less | 0.01 or less | 0.01 or less |

|  |  | Contents of metal element (ppm) | | | | | | |
|---|---|---|---|---|---|---|---|---|
|  | No. | Ni | Rh | Al | Fe | Total amount | Si | P |
| Examples | 1 | 0.01 or less | 0.2 | 59 | 13 | 381 | 4.7 | 1.8 |
|  | 2 | 0.01 or less | 0.2 | 59 | 13 | 375 | 4.7 | 1.8 |
|  | 3 | 0.01 or less | 0.3 | 20 | 6.7 | 129 | 4.7 | 1.8 |
|  | 4 | 0.01 or less | 0.3 | 20 | 6.7 | 79 | 4.7 | 1.8 |

TABLE 2-continued

|  |  |  |  |  |  |  |  |  |
|---|---|---|---|---|---|---|---|---|
|  |  | 5 | 0.01 or less | 0.3 | 100 | 8.3 | 125 | 3.0 | 2.5 |
|  |  | 6 | 0.01 or less | 0.3 | 34 | 8.3 | 59 | 3.0 | 2.5 |
|  |  | 7 | 0.01 or less | 0.3 | 33 | 300 | 349 | 4.1 | 3.0 |
|  |  | 8 | 0.01 or less | 0.3 | 32 | 100 | 148 | 4.1 | 3.0 |
|  |  | 9 | 0.01 or less | 0.3 | 32 | 7.8 | 153 | 4.1 | 2.6 |
|  |  | 10 | 0.01 or less | 0.3 | 32 | 7.8 | 152 | 4.1 | 2.6 |
|  |  | 11 | 0.01 or less | 0.3 | 31 | 7.5 | 250 | 4.1 | 2.2 |
|  |  | 12 | 0.01 or less | 200 | 31 | 7.5 | 250 | 4.1 | 2.2 |
|  |  | 13 | 0.01 or less | 0.3 | 32 | 7.7 | 140 | 4.1 | 2.0 |
|  |  | 14 | 0.01 or less | 0.3 | 32 | 8.2 | 143 | 50 | 2.0 |
|  |  | 15 | 0.01 or less | 0.2 | 59 | 13 | 187 | 4.5 | 2.0 |
|  |  | 16 | 0.01 or less | 0.2 | 61 | 13 | 189 | 4.5 | 2.0 |
|  |  | 17 | 100 | 0.2 | 60 | 13 | 226 | 4.5 | 2.0 |
|  |  | 18 | 100 | 0.3 | 29 | 6.9 | 153 | 4.1 | 2.2 |
|  |  | 19 | 10 | 0.3 | 300 | 6.7 | 343 | 4.1 | 2.2 |
|  |  | 20 | 10 | 0.3 | 31 | 9.2 | 125 | 4.1 | 50 |
|  |  | 21 | 0.01 or less | 0.3 | 30 | 7.7 | 61 | 4.1 | 50 |
|  |  | 22 | 0.01 or less | 0.3 | 28 | 11 | 62 | 4.1 | 2.2 |
|  |  | 23 | 0.01 or less | 0.2 | 17 | 50 | 81 | 4.1 | 2.2 |
|  |  | 24 | 0.01 or less | 0.2 | 50 | 40 | 97 | 4.1 | 2.2 |
|  |  | 25 | 0.3 | 0.2 | 42 | 50 | 110 | 4.1 | 2.2 |
|  |  | 26 | 0.01 or less | 0.3 | 59 | 400 | 661 | 0.5 | 2.0 |
| Comparative Examples | 1 | 0.01 or less | 0.01 or less | 0.01 or less | 0.01 or less | 0.05 or less | 0.01 or less | 0.01 or less |
|  | 2 | 0.01 or less | 0.01 or less | 0.01 or less | 0.01 or less | 0.05 or less | 0.01 or less | 0.01 or less |
|  | 3 | 0.01 or less | 0.01 or less | 0.01 or less | 0.01 or less | 0 05 or less | 0.01 or less | 0.01 or less |
|  | 4 | 0.01 or less | 0.01 or less | 0.01 or less | 0.01 or less | 0.05 or less | 0.01 or less | 0.01 or less |
|  | 5 | 0.01 or less | 0.01 or less | 0.01 or less | 0.01 or less | 1,400 | 0.01 or less | 0.01 or less |
|  | 6 | 0.01 or less | 600 | 0.01 or less | 0.01 or less | 1,800 | 0.01 or less | 0.01 or less |
|  | 7 | 0.01 or less | 0.01 or less | 0.01 or less | 600 | 1,400 | 0.01 or less | 0.01 or less |

TABLE 3

|  | No. | Polymer synthesis No. | Varnishes | | | Films | | |
|---|---|---|---|---|---|---|---|---|
|  |  |  | Mw | Mn | Transmittance | Bending test, 100,000 times | Surface smoothness, Ra nm | Y1 |
| Examples | 1 | Synthesis example 1-1 | 150,000 | 69,000 | VG | G | 1 or less | VG |
|  | 2 | Synthesis example 1-2 | 130,000 | 59,000 | VG | G | 1 or less | VG |
|  | 3 | Synthesis example 2-1 | 120,000 | 56,000 | VG | G | 1 or less | VG |
|  | 4 | Synthesis example 2-2 | 100,000 | 45,000 | VG | G | 1 or less | VG |
|  | 5 | Synthesis example 3-1 | 80,000 | 36,000 | VG | G | 1 or less | VG |
|  | 6 | Synthesis example 3-2 | 65,000 | 28,000 | VG | G | 1 or less | VG |

TABLE 3-continued

|  | No. | Polymer synthesis No. | Varnishes Mw | Mn | Transmittance | Films Bending test, 100,000 times | Surface smoothness, Ra nm | Y1 |
|---|---|---|---|---|---|---|---|---|
|  | 7 | Synthesis example 4-1 | 95,000 | 43,000 | VG | G | 1 or less | VG |
|  | 8 | Synthesis example 4-2 | 85,000 | 40,000 | VG | G | 1 or less | VG |
|  | 9 | Synthesis example 5-1 | 90,000 | 41,000 | VG | G | 1 or less | VG |
|  | 10 | Synthesis example 5-2 | 80,000 | 38,000 | VG | G | 1 or less | VG |
|  | 11 | Synthesis example 6 | 90,000 | 42,000 | VG | G | 1 or less | VG |
|  | 12 | Synthesis example 7 | 100,000 | 45,000 | VG | G | 1 or less | VG |
|  | 13 | Synthesis example 8 | 120,000 | 58,000 | G | G | 1 or less | G |
|  | 14 | Synthesis example 9 | 125,000 | 60,000 | G | G | 1 or less | G |
|  | 15 | Synthesis example 10 | 110,000 | 53,000 | VG | G | 1 or less | VG |
|  | 16 | Synthesis example 11 | 110,000 | 52,000 | VG | G | 1 or less | VG |
|  | 17 | Synthesis example 12 | 110,000 | 52,000 | VG | G | 1 or less | VG |
|  | 18 | Synthesis example 13 | 90,000 | 42,000 | VG | G | 1 or less | VG |
|  | 19 | Synthesis example 14 | 90,000 | 41,000 | VG | G | 1 or less | VG |
|  | 20 | Synthesis example 15 | 95,000 | 45,000 | VG | G | 1 or less | VG |
|  | 21 | Synthesis example 16 | 100,000 | 46,000 | VG | G | 1 or less | VG |
|  | 22 | Synthesis example 17 | 90,000 | 40,000 | VG | G | 1 or less | VG |
|  | 23 | Synthesis example 18 | 80,000 | 35,000 | VG | G | 1 or less | VG |
|  | 24 | Synthesis example 19 | 67,000 | 30,000 | VG | G | 1 or less | VG |
|  | 25 | Synthesis example 20 | 90,000 | 39,000 | VG | G | 1 or less | VG |
|  | 26 | Synthesis example 1-3 | 210,000 | 89,000 | VG | G | 1 or less | VG |
| Comparative Examples | 1 | Comparative synthesis example 1 | 58,000 | 24,000 | VG | P | 50 | VG |
|  | 2 | Comparative synthesis example 2 | 50,000 | 21,000 | VG | P | 100 | VG |
|  | 3 | Comparative synthesis example 3 | 41,000 | 17,000 | VG | P | 50 | VG |
|  | 4 | Comparative synthesis example 4 | 40,000 | 16,000 | VG | P | 2 | VG |
|  | 5 | Comparative synthesis example 5 | 160,000 | 73,000 | G | G | 1 or less | P |
|  | 6 | Comparative synthesis example 6 | 152,000 | 72,000 | P | G | 1 or less | P |
|  | 7 | Comparative synthesis example 7 | 125,000 | 58,000 | G | G | 1 or less | P |

INDUSTRIAL APPLICABILITY

The varnish of the present invention can be used for production of substrate films, such as a surface protective film, a color filter, a TFT, etc., and polyimide films used as a dielectric protective film. The polyimide films and laminates in the present embodiment are appropriately utilized for products of optical devices such as a display having a touch panel function, an organic EL light-emitting device, a smartphone, and a tablet terminal; a flexible optical device such as a flexible display device, a flexible solar cell, a flexible touch panel, a bendable smartphone and tablet terminal; other flexible devices such as a flexible battery; an organic EL light-emitting device having a curved surface and an organic EL display; etc.

REFERENCE SINGS LIST

1. Film
2. Plunger
3. Chuck
4. Turntable
5. Clamp
6. Bending angle

The invention claimed is:

1. A varnish containing a polymer (α) and a solvent (β),
wherein the polymer (α) is a polyimide or a polyimide precursor,
wherein the varnish contains at least one metal element(s) that contains at least one selected from the group consisting of Zn, Zr, Cu, Cr, Mn, Co, Pd, Ni, Rh, Al and Fe,
wherein at least one of the metal element(s) contained in the varnish is present in an amount of from 0.05 to 500 ppm relative to the polymer (α),
wherein the varnish has a light transmittance at a wavelength of 450 nm of from 60% or more which is measured at an optical path length of 10 mm when a concentration of the polymer (α) in the solvent (β) is adjusted to 20% by weight,
wherein the total amount of the metal element(s) contained in the varnish is 59 ppm or more relative to the polymer (α).

2. The varnish according to claim 1, wherein at least one of the metal element(s) contained in the varnish is present in an amount of from 0.05 to 100 ppm relative to the polymer (α).

3. The varnish according to claim 1, wherein the metal element contains Zn.

4. The varnish according to claim 1, wherein the metal element contains Zr.

5. The varnish according to claim 1, wherein the metal element contains Cu.

6. The varnish according to claim 1, wherein the metal element contains Cr.

7. The varnish according to claim 1, wherein the metal element contains at least one selected from the group consisting of Mn, Co, Pd, Ni, Rh and Al.

8. The varnish according to claim 1, wherein the metal element contains Fe.

9. The varnish according to claim 1, wherein the metal element contains Fe, and Fe is present in an amount of from 50 ppm to 500 ppm relative to the polymer (α).

10. The varnish according to claim 1, further containing a non-metal element, wherein the non-metal element is P,
wherein the non-metal element contained in the varnish is present in an amount of from 0.05 to 100 ppm relative to the polymer (α).

11. The varnish according to claim 1, wherein the polymer (α) is polyimide.

12. The varnish according to claim 11, wherein the solvent (β) is γ-butyrolactone.

13. The varnish according to claim 12, wherein the metal element contains Cu.

14. The varnish according to claim 1, wherein the total amount of the metal element(s) contained in the varnish is 59 to 500 ppm relative to the polymer (α).

15. The varnish according to claim 1, which is used for forming a polyimide layer of a flexible display device or a polyimide layer of an organic EL light-emitting device.

16. A method for producing a polyimide varnish, comprising:

(a) dissolving diamine and acid dianhydride in a solvent to produce a polyimide precursor; and
(b) heating the polyimide precursor in the solvent to produce a polyimide;
wherein in step (b), at least one metal element(s) selected from the group consisting of Zn, Zr, Cu, Cr, Mn, Co, Pd, Ni, Rh, Al and Fe is present in the solvent,
wherein the varnish has a light transmittance at a wavelength of 450 nm of from 60% or more which is measured at an optical path length of 10 mm when a concentration of the polyimide or polyimide precursor in the solvent is adjusted to 20% by weight, and
wherein the total amount of the metal element(s) contained in the varnish is 59 ppm or more relative to the polyimide or polyimide precursor.

17. The method for producing the polyimide varnish according to claim 16, wherein the metal element contains Cu.

18. A varnish containing a polymer (α) and a solvent (β),
wherein the polymer (α) is a polyimide or a polyimide precursor,
wherein the varnish contains at least one metal element(s) that contains at least one selected from the group consisting of Zn, Zr, Cu, Cr, Mn, Co, Pd, Ni, Rh, Al and Fe, and
wherein at least one of the metal element(s) contained in the varnish is present in an amount of from 0.05 to 500 ppm relative to the polymer (α),
wherein the varnish has a light transmittance at a wavelength of 450 nm of from 60% or more which is measured at an optical path length of 10 mm when a concentration of the polymer (α) in the solvent (β) is adjusted to 20% by weight,
wherein the polymer (α) is a polyimide represented by the following formula (1) or a precursor thereof:

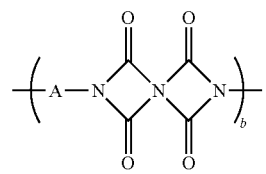

(1)

wherein A is a divalent organic group, B is a tetravalent organic group, and n is 2 or greater, and
wherein A is at least one structure(s) selected from the group consisting of the following formulae (A-1), (A-2), (A-3) and (A-4):

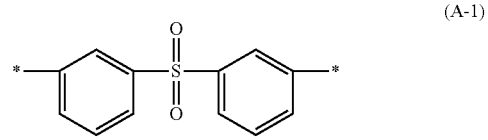

(A-1)

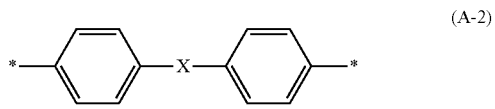

(A-2)

wherein X is a divalent organic group selected from the following formulas (X-1) to (X-3):
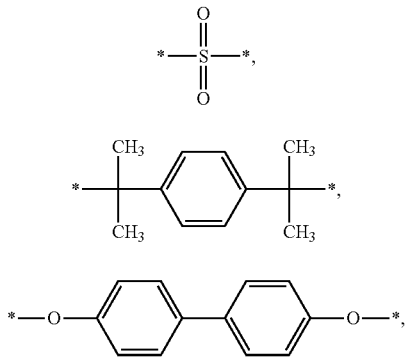
(X-1)
(X-2)
(X-2)
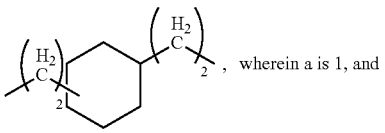, wherein a is 1, and
(X-3)
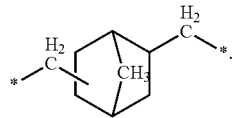
(X-4)
19. The varnish according to claim 1, further containing a non-metal element, wherein the non-metal element is Si, wherein the non-metal element contained in the varnish is present in an amount of from 0.05 to 100 ppm relative to the polymer (α).
* * * * *